(12) United States Patent
Sato

(10) Patent No.: US 11,422,462 B2
(45) Date of Patent: Aug. 23, 2022

(54) FORMING APPARATUS THAT CONTROLS CHUCKING FORCE

(71) Applicant: CANON KABUSHIKI KAISHA, Tokyo (JP)

(72) Inventor: Takahiro Sato, Utsunomiya (JP)

(73) Assignee: CANON KABUSHIKI KAISHA, Tokyo (JP)

(\*) Notice: Subject to any disclaimer, the term of this patent is extended or adjusted under 35 U.S.C. 154(b) by 0 days.

(21) Appl. No.: 16/892,389

(22) Filed: Jun. 4, 2020

(65) Prior Publication Data

US 2020/0387067 A1 Dec. 10, 2020

(30) Foreign Application Priority Data

Jun. 7, 2019 (JP) .............................. JP2019-107449

(51) Int. Cl.
| | | |
|---|---|---|
| G03F 7/00 | (2006.01) |
| H01L 21/687 | (2006.01) |
| H01L 21/683 | (2006.01) |
| G03F 7/20 | (2006.01) |
| B29C 59/02 | (2006.01) |
| B29C 59/00 | (2006.01) |
| B82Y 40/00 | (2011.01) |

(52) U.S. Cl.
CPC .......... *G03F 7/0002* (2013.01); *B29C 59/002* (2013.01); *B29C 59/02* (2013.01); *G03F 7/707* (2013.01); *H01L 21/683* (2013.01); *H01L 21/687* (2013.01); *B82Y 40/00* (2013.01)

(58) Field of Classification Search
CPC .................................................... G03F 7/0002
See application file for complete search history.

(56) References Cited

U.S. PATENT DOCUMENTS

| | | | |
|---|---|---|---|
| 9,400,426 B2 | 7/2016 | Hamaya | |
| 2005/0276919 A1* | 12/2005 | Truskett | G03F 7/0002 |
| | | | 427/230 |
| 2007/0190200 A1* | 8/2007 | Cherala | B82Y 10/00 |
| | | | 425/385 |
| 2018/0117805 A1* | 5/2018 | Choi | G03F 7/0002 |

FOREIGN PATENT DOCUMENTS

| | | | |
|---|---|---|---|
| JP | 4648408 B2 | 3/2011 |
| JP | 6004738 B2 | 10/2016 |
| WO | 2006083518 A2 | 8/2006 |

\* cited by examiner

*Primary Examiner* — Binu Thomas
(74) *Attorney, Agent, or Firm* — Roosi, Kimms & McDowell LLP

(57) ABSTRACT

A forming apparatus includes a substrate holder having a plurality of chucking regions that chuck a lower surface of the substrate and configured to hold the substrate by chucking the substrate with the plurality of chucking regions, and a controller configured to control execution of a forming process and independently control a chucking force of each of the plurality of chucking regions. The controller controls a chucking force of each of the plurality of chucking regions in a mold separation step so as to make a final mold separation point, at which the mold finally separates from the composition, coincide with a center of a pattern surface of the mold.

10 Claims, 18 Drawing Sheets

… (1)

FORMING APPARATUS THAT CONTROLS CHUCKING FORCE

BACKGROUND OF THE INVENTION

Field of the Invention

The present invention relates to a forming apparatus and a method of manufacturing an article.

Description of the Related Art

There is available a forming apparatus that forms a curable composition arranged on a substrate by a forming process. A forming process can include a contact step of bringing a composition on a substrate into contact with a mold, a curing step of curing the composition in contact with the mold, and a separation step of separating the cured composition from the mold.

As a typical example of a forming apparatus, much attention has been paid to an imprint apparatus to be used to manufacture articles such as semiconductor devices. For example, an imprint apparatus using a photo-curing method is configured to supply, first, an imprint material, which is a photo-curable composition, onto a shot region as an imprint region on a substrate. The apparatus then brings a mold into contact with the imprint material supplied onto the substrate while aligning a pattern portion of the mold with the shot region, and fills the mold with the imprint material. The apparatus cures the imprint material by irradiating it with light, and then separates the mold from the imprint material (mold separation). In this manner, a pattern of the imprint material is formed on each shot region on the substrate.

The imprint apparatus suffers from a problem that a mold slips off a mold holder or a formed pattern breaks unless mold separation is performed under proper control. Japanese Patent No. 4648408 discloses a technique of reducing the separation force required to separate a mold from a cured imprint material by controlling the substrate chucking forces of a plurality of chucking regions that hold a substrate in order to prevent a formed pattern from breaking. Japanese Patent No. 6004738 discloses a technique of controlling a driver to move the centroids of an imprint material, a mold, and a contact region toward the center of a shot region (pattern formation region) at the time of mold separation.

However, a final mold separation point is sometimes shifted from the centroids of an imprint material, a mold, and a contact region before mold separation, resulting in decentering, depending on a plurality of chucking regions, the size of a pattern portion, and the positional relationship between them on a substrate subjected to imprinting disclosed in Japanese Patent No. 4648408. Decentering can generate large stress in a mold and hence can be a cause of breakage of the mold. When the mold breaks, the mold reaches the end of its service life.

In the method disclosed in Japanese Patent No. 6004738, a pattern susceptible to pattern displacement in the planar direction such as a line/space pattern may suffer from a pattern defect such as pattern collapse.

SUMMARY OF THE INVENTION

The present invention provides, for example, a technique advantageous in simultaneously reducing pattern defects and increasing the service life of a mold.

The present invention in its one aspect provides a forming apparatus that performs a forming process including a contact step of bringing a composition on a substrate into contact with a mold, a curing step of curing the composition while the composition is in contact with the mold, and a mold separation step of separating the cured composition from the mold. The apparatus comprises a substrate holder having a plurality of chucking regions that chuck a lower surface of the substrate and configured to hold the substrate by chucking the substrate with the plurality of chucking regions, and a controller configured to control execution of the forming process and independently control a chucking force of each of the plurality of chucking regions, wherein the controller controls a chucking force of each of the plurality of chucking regions in the mold separation step so as to make a final mold separation point, at which the mold finally separates from the composition, coincide with a center of a pattern surface of the mold.

Further features of the present invention will become apparent from the following description of exemplary embodiments (with reference to the attached drawings).

DESCRIPTION OF THE EMBODIMENTS

Figure 1:
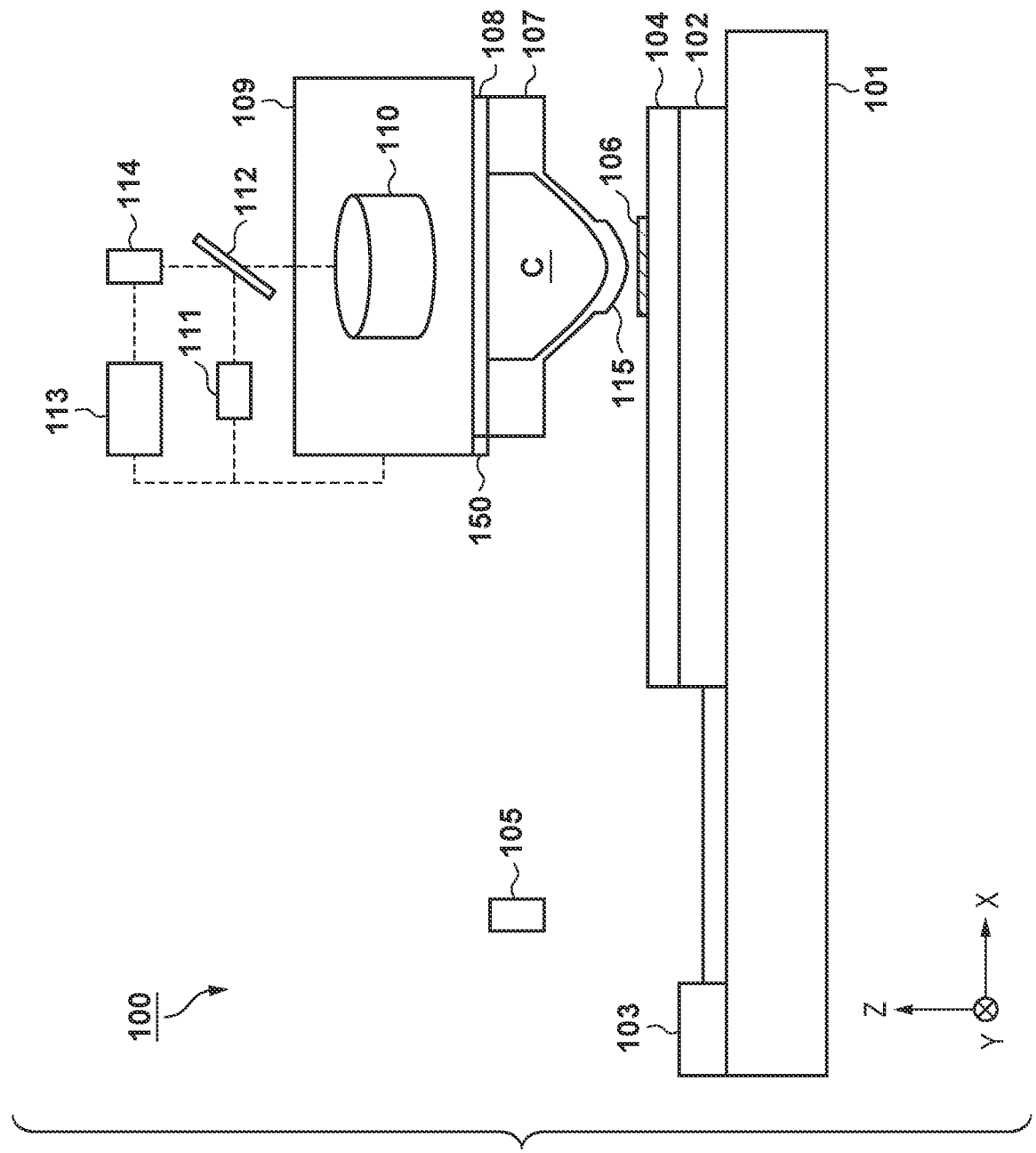
FIG. 1 is a view showing the arrangement of an imprint apparatus according to an embodiment.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

First Embodiment

The present invention relates to a forming apparatus that performs a forming process of forming a curable composition (to be also simply referred to as a "composition" hereinafter) on a substrate. A forming process can include a supply step of discretely supplying liquid droplets of a composition onto a substrate and a contact step of bringing the composition supplied onto the substrate into contact with a member as a mold (original or template). The forming process can also include a curing step of curing the composition in contact with the mold and a mold separation step of separating the cured composition from the mold.

This embodiment will exemplify an imprint apparatus as a specific example of a forming apparatus. The imprint apparatus is an apparatus for bringing an imprint material supplied onto a substrate into contact with a mold, applying curing energy to the imprint material, and forming a pattern of the cured product to which a concave-convex pattern of the mold is transferred.

As an imprint material, a curable composition (to be also referred to uncured resin) to be cured by receiving the curing energy is used. Examples of the curing energy are an electromagnetic wave, heat, and the like. The electromagnetic wave is, for example, light selected from the wavelength range of 10 nm (inclusive) to 1 mm (inclusive). Examples of the electromagnetic wave can be infrared light, visible light, and ultraviolet light. The curable composition can be a composition cured with light irradiation or heating. Among these compositions, the photo-curable composition cured by light irradiation contains at least a polymerizable composition and a photopolymerization initiator, and may further contain a nonpolymerizable compound or a solvent, as needed. The nonpolymerizable compound is at least one material selected from the group consisting of a sensitizer, a hydrogen donor, an internal mold release agent, a surfactant, an antioxidant, and a polymer component. The imprint material can be arranged on the substrate in the form of droplets or in the form of an island or film obtained by connecting a plurality of droplets supplied by the supplier. The viscosity (the viscosity at 25° C.) of the imprint material is, for example, 1 mPa·s (inclusive) to 100 mPa·s (inclusive). Examples of the substrate material can be glass, a ceramic, a metal, a semiconductor, a resin, and the like. A member made of a material different from the substrate may be formed on the surface of the substrate, as needed. Examples of the substrate are a silicon wafer, a compound semiconductor wafer, and silica glass.

In the specification and the accompanying drawings, directions will be indicated in an XYZ coordinate system in which directions parallel to the surface of a substrate are included in an X-Y plane. Assume that directions parallel to the X-axis, the Y-axis, and the Z-axis of the XYZ coordinate system are the X direction, the Y direction, and the Z direction, respectively. Control or driving concerning the X-axis, the Y-axis, and the Z-axis means control or driving concerning a direction parallel to the X-axis, a direction parallel to the Y-axis, and a direction parallel to the Z-axis.

FIG. 1 is a view showing the arrangement of an imprint apparatus 100 according to an embodiment. The imprint apparatus 100 includes a stage 101, a mold driver 109, an irradiator 111, a supplier 105, an image obtainer 114, a chucking force controller 103, and a controller 113. The controller 113 is constituted by a computer including, for example, a CPU and a memory. The controller 113 controls each unit of the imprint apparatus 100, and controls an imprint process in particular in this embodiment. Note that the chucking force controller 103 and the controller 113 may be formed from one controller that controls the execution of a forming process and also independently controls a chucking force in each of the plurality of chucking regions. A mold 107 includes a pattern portion 115 (also called a mesa portion) on which a pattern is formed (to be described in detail later). An imprint process can include a process (liquid contact) of starting to bring the pattern portion 115 (pattern surface) into contact with an imprint material 106 on a substrate 104 in a contact step and gradually expanding the contact region between the pattern portion 115 and the imprint material 106. The imprint process can also include a process of separating the mold 107 from the imprint material 106 in a mold separation step after curing the imprint material 106 in a curing step.

The stage 101 includes, for example, a substrate holder 102 and can move while holding the substrate 104. The substrate holder 102 holds the substrate 104 with, for example, vacuum chucking force or electrostatic force. The stage 101 mechanically holds the substrate holder 102 and drives the substrate holder 102 (that is, the substrate 104) in the X and Y directions. The stage 101 may be configured to be able to change the Z-direction position of the substrate 104, the tilt of the substrate 104 with respect to the X-Y plane, and the rotation of the X-Y plane. The substrate 104 can be formed from a silicon wafer, silica glass, or the like, and may be provided with an adhesion layer for improving the adhesiveness between an imprint material and a substrate as needed before the supply of the imprint material.

The mold driver 109 is configured to be able to change the Z-direction positions and tilts of a mold holder 108, which holds the mold 107 with, for example, vacuum chucking force or electrostatic force, and the mold 107. In addition, the mold driver 109 may be configured to be able to adjust the X- and Y-direction positions of the mold 107.

The arrangement of the mold driver 109 will be described below. The mold driver 109 includes, for example, a plurality of actuators. Controlling each of the plurality of actuators can change the relative position and/or tilt between the mold 107 and the substrate 104. The plurality of actuators can be provided with a displacement sensor and a force sensor. The displacement sensor detects the amount of displacement between the two ends of each actuator (the amount by which each actuator displaces a mold). The force sensor detects the force generated by each actuator. The force actuator can also measure the separation force generated by the actuators at the time of mold separation.

In this embodiment, the mold driver 109 functions as a driver that drives the mold 107 to come into contact with the imprint material 106 on the substrate 104. However, this is not exhaustive. For example, the stage 101 may function as the driver or both the mold driver 109 and the stage 101 may function as the driver.

The mold 107 held by the mold driver 109 is generally prepared by a material that can transmit ultraviolet light, such as quartz. The substrate-side surface (pattern surface) of the mold 107 is provided with a pattern portion 115 on which a concave-convex pattern to be transferred as a device pattern onto the substrate 104 is formed. The pattern portion 115 has a mesa shape formed from, for example, a stepped portion of about several ten μm. The size of the pattern portion 115 is generally 33 mm×26 mm, although it differs depending on the device pattern to be transferred onto a substrate. A cavity (concave portion) is formed in the surface of the mold 107 which is located on the opposite side to the pattern surface so as to reduce the thicknesses of the pattern portion 115 and its surrounding portion in order to make the pattern portion 115 easily deformable. This cavity is formed into an almost sealed space C by making the mold driver 109 (mold holder 108) hold the mold 107. The cavity is connected to a pneumatic system through a pipe.

The irradiator 111 irradiates, through the mold 107, the substrate 104 with light (ultraviolet light) that cures the imprint material 106 in a process of curing the imprint material 106 on the substrate 104. In this embodiment, the light emitted from the irradiator 111 is reflected by a beam splitter 112 (band filter) to irradiate the substrate 104 through a relay optical system 110 and the mold 107. The supplier 105 supplies (coats) an imprint material 106 onto a substrate. As described above, the imprint apparatus 100 according to this embodiment can use, as the imprint material 106, a photo-curable composition having the property of being cured by irradiation with light (for example, ultraviolet light).

The image obtainer 114 is an imaging device that captures an image of the pattern portion 115 of the mold 107 through the beam splitter 112 and the relay optical system 110. For example, in a mold separation step, the image obtainer 114 can capture an image of the contact region between the pattern portion 115 of the mold 107 and the imprint material 106 on the substrate 104 at each of a plurality of timings. In a contact step, because the interference fringe caused by contact between the mold 107 and the substrate 104 is formed on each image obtained by the image obtainer 114, it is possible to observe the manner of expansion of the contact region between the pattern portion 115 and the imprint material 106. In addition, in this embodiment, in the mold separation step as well, the image obtainer 114 captures an image of the contact region between the pattern portion 115 on the mold 107 and the imprint material 106 on a shot region at each of a plurality of timings. Note that this apparatus may include an alignment scope (detector) for detecting the alignment marks formed on the mold 107 and the substrate 104.

Figure 2A:
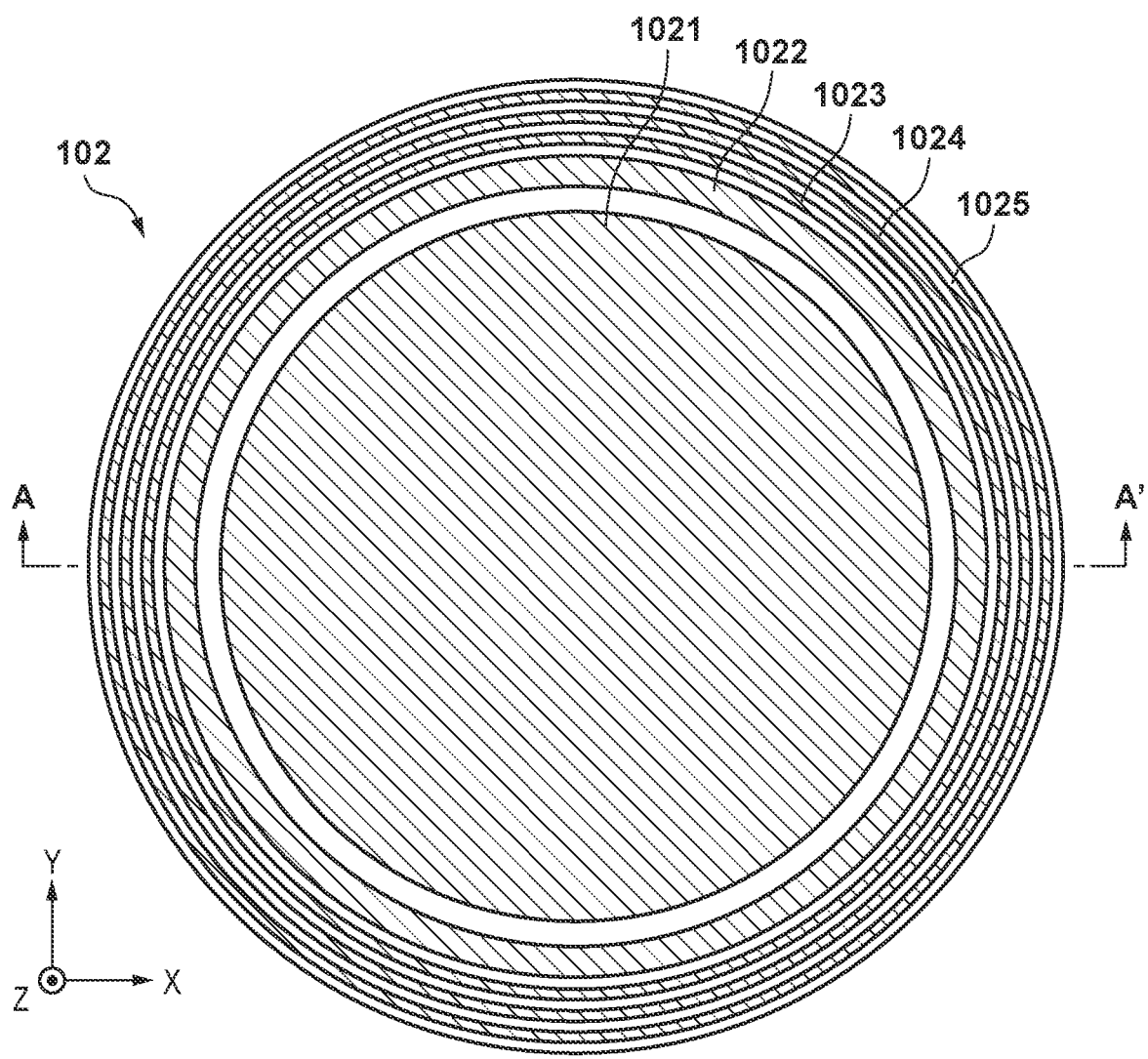
FIGS. 2A and 2B are views showing the arrangement of a substrate holder according to the embodiment.
Figure 2B:
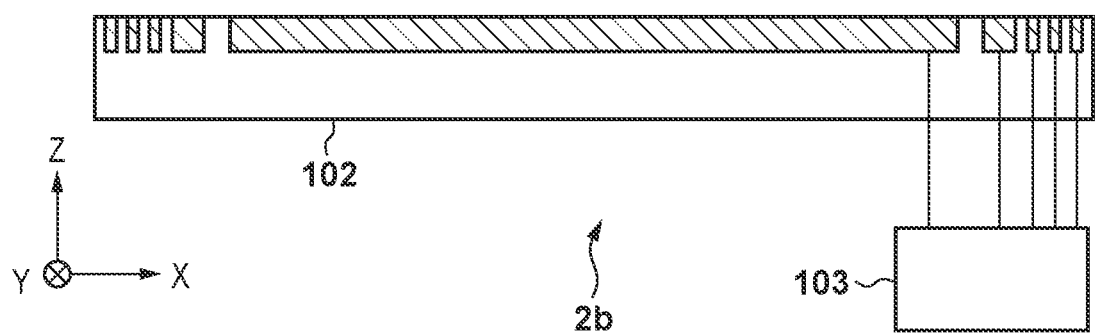

The substrate holder 102 according to this embodiment will be described next with reference to FIGS. 2A and 2B. FIG. 2A is a plan view of the substrate holder 102 when viewed from the mold 107 side. FIG. 2B is a sectional view of the substrate holder 102 taken along line A-A'. A plurality of chucking regions including a first chucking region 1021, a second chucking region 1022, a third chucking region 1023, a fourth chucking region 1024, and a fifth chucking region 1025 are concentrically formed on the surface of the substrate holder 102 which is in contact with the lower surface of the substrate 104. Note that the number of chucking regions is not limited to five, and may be less or more. Each of the plurality of chucking regions is connected to the chucking force controller 103 through a pipe. The chucking force controller 103 chucks and fixes a substrate on the respective chucking regions by, for example, adjusting the inside of each chucking region to a negative pressure by a pressure adjusting device (not shown). In the embodiment, a pressure adjusting device is provided for each chucking region, and the chucking force controller 103 can independently control each pressure adjusting device.

Figure 18A:
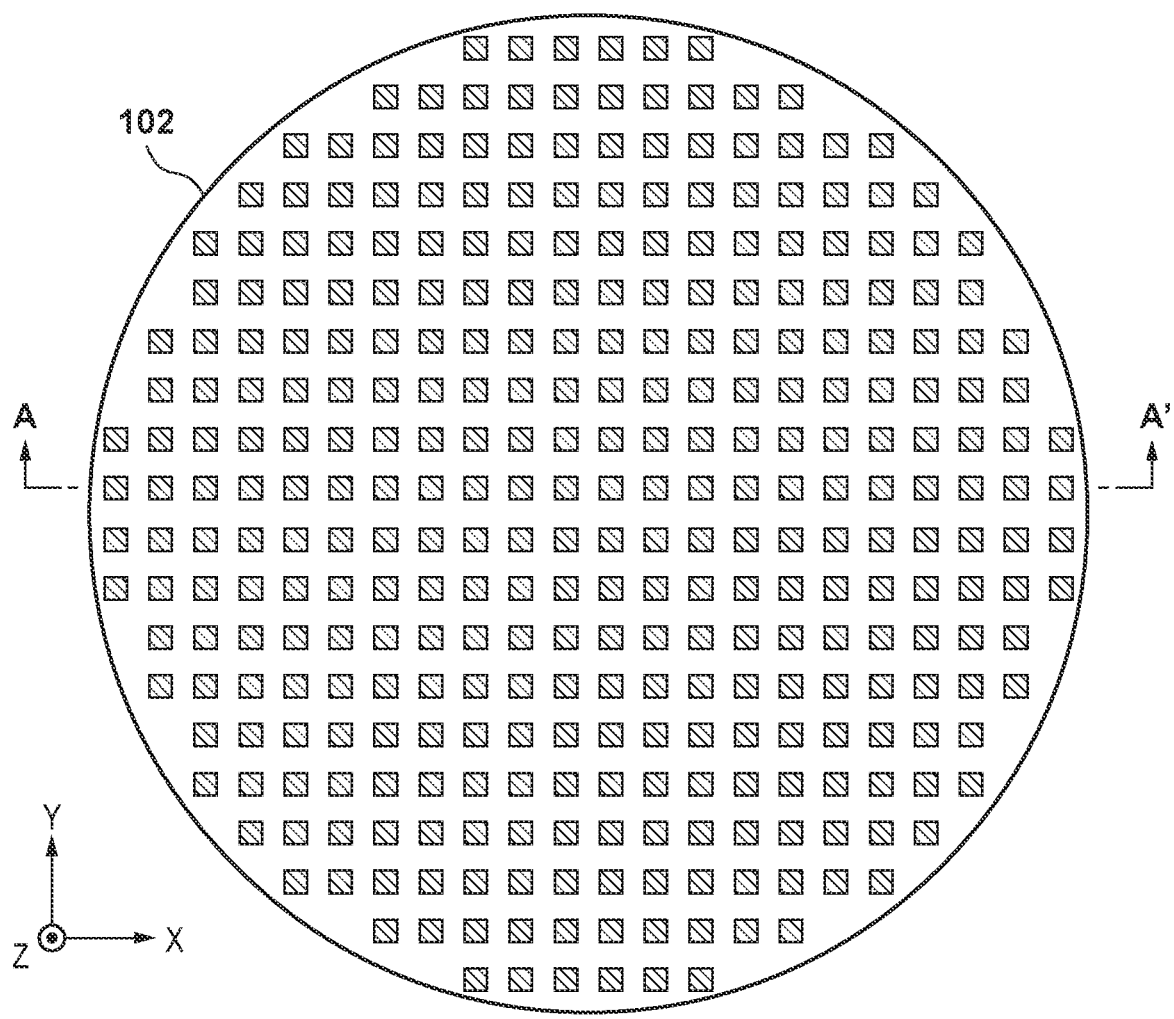
FIGS. 18A and 18B are views showing the arrangement of a substrate holder according to an embodiment.
Figure 18B:
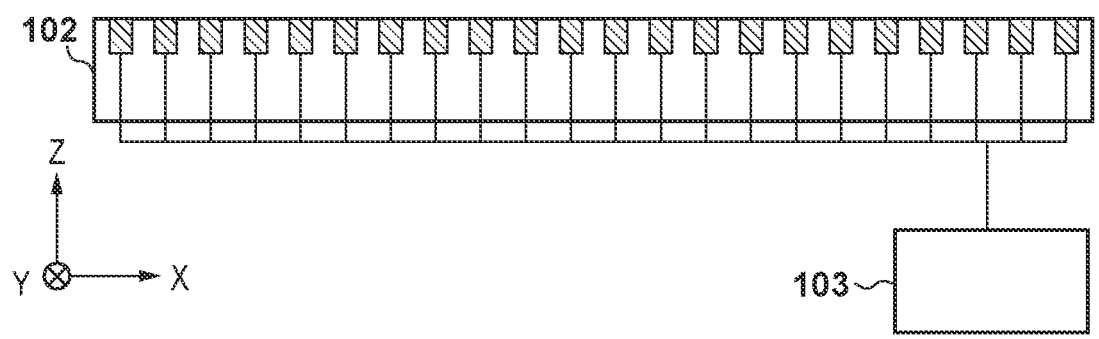

FIGS. 18A and 18B show another example of the arrangement of the substrate holder 102. FIG. 18A is a plan view of the substrate holder 102 when viewed from the mold 107 side. FIG. 18B is a sectional view of the substrate holder 102 taken along line A-A'. A plurality of chucking regions are formed in a matrix pattern on the surface of the substrate holder 102 which is in contact with the lower surface of the substrate 104. Each of the plurality of chucking regions is connected to the chucking force controller 103. This makes it possible to independently control the chucking force of each chucking region. The following description is based on the arrangement shown in FIGS. 2A and 2B.

Figure 3:
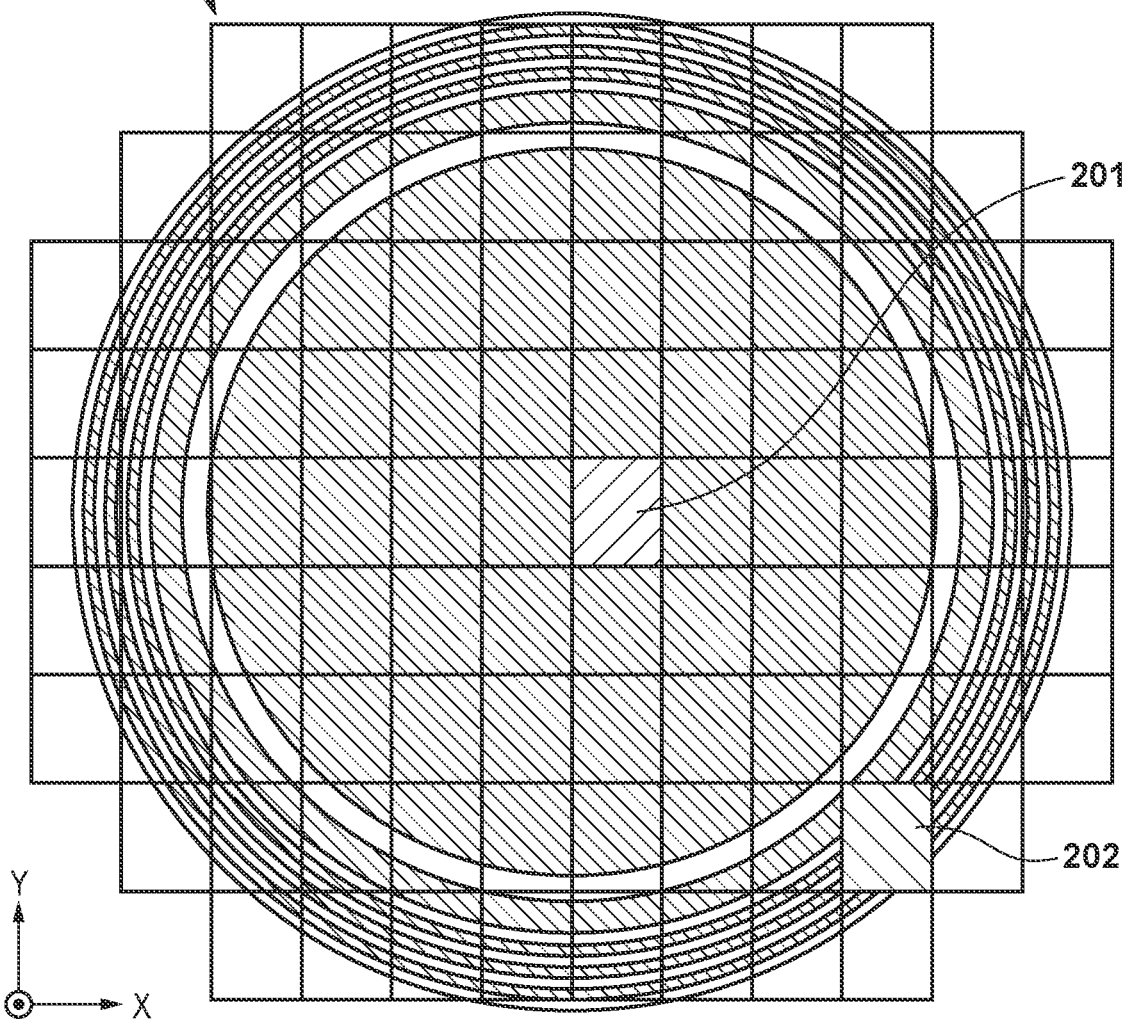
FIG. 3 is a view showing the shot layout of a substrate superimposed on chucking regions.

FIG. 3 shows an example of a shot layout 200 as a layout of a plurality of shot regions on the substrate 104, with the shot layout being superimposed on a plurality of chucking regions on the substrate holder 102 shown in FIG. 2A. Each rectangle of the shot layout 200 represents one shot region. One shot region is a region subjected to one imprint process using the mold 107, and corresponds to, for example, one semiconductor chip. As is obvious from FIG. 3, the plurality of shot regions include a shot region 201 chucked by the substrate holder 102 with only one chucking region and a shot region 202 that straddles a plurality of chucking regions and is chucked by the substrate holder 102 with the plurality of chucking regions.

The following will clarify a problem at the time of mold separation in the shot region 202 straddling a plurality of chucking regions.

Figure 4:
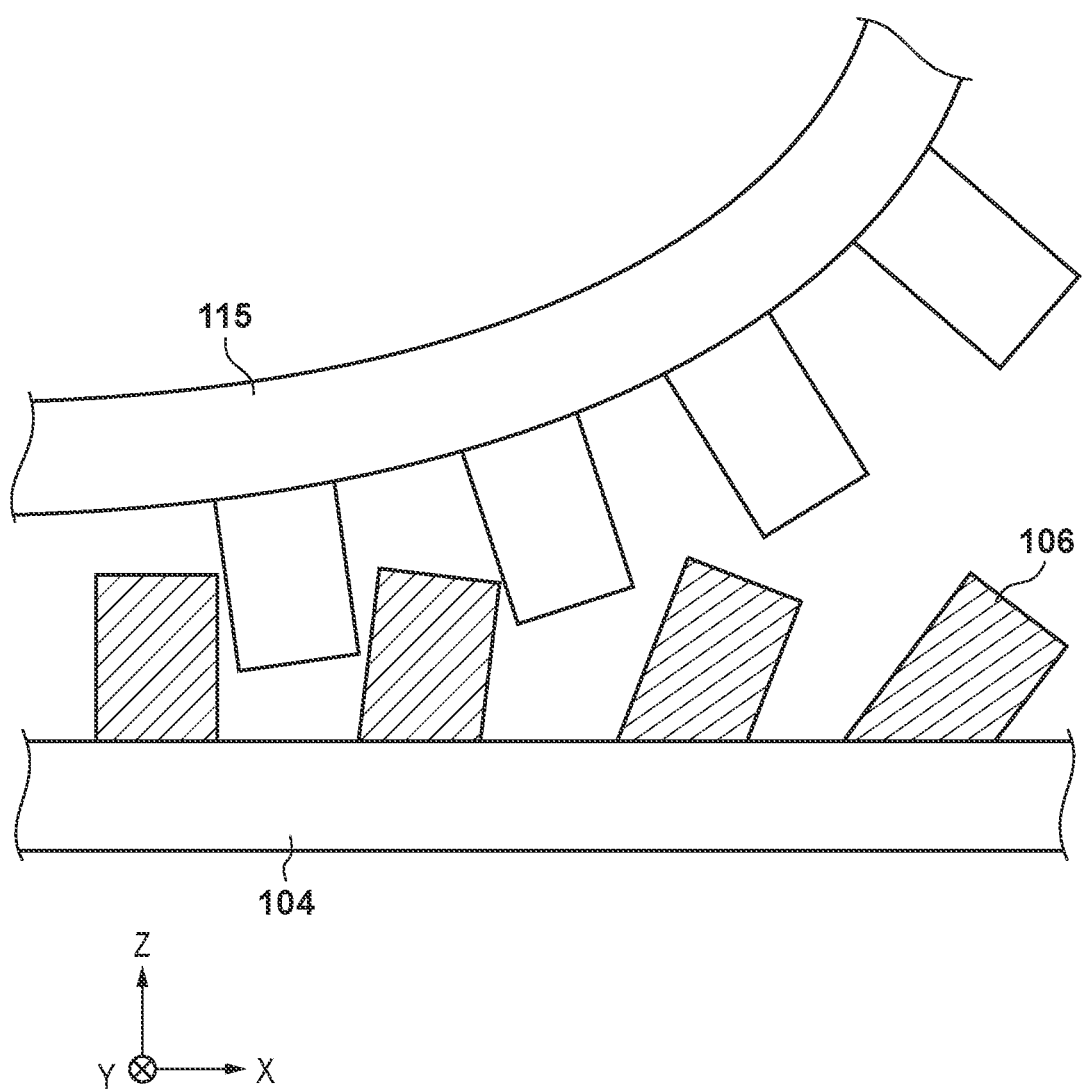
FIG. 4 is a view for explaining pattern breakage that can occur at the time of mold separation.

FIG. 4 exemplarily shows pattern breakage which can occur on the imprint material 106 at the time of mold separation. As described above, a cavity (concave portion) is formed in the surface of the mold 107 which is located on the opposite side to the pattern surface. Accordingly, as long as the substrate 104 is held parallel to the substrate holder 102, the contact region between the imprint material 106 and the pattern portion 115 concentrically decreases from an end portion of the pattern portion 115 along with the progress of mold separation. In this case, however, along with the progress of mold separation, the contact point between the cured imprint material 106 on the substrate 104 and the pattern portion 115 of the imprint material 106 shifts in the X-Y direction. This shift in the X-Y direction can be a pattern defect such as pattern collapse depending on the height of the pattern to be formed and the component of the imprint material 106.

Figure 5:
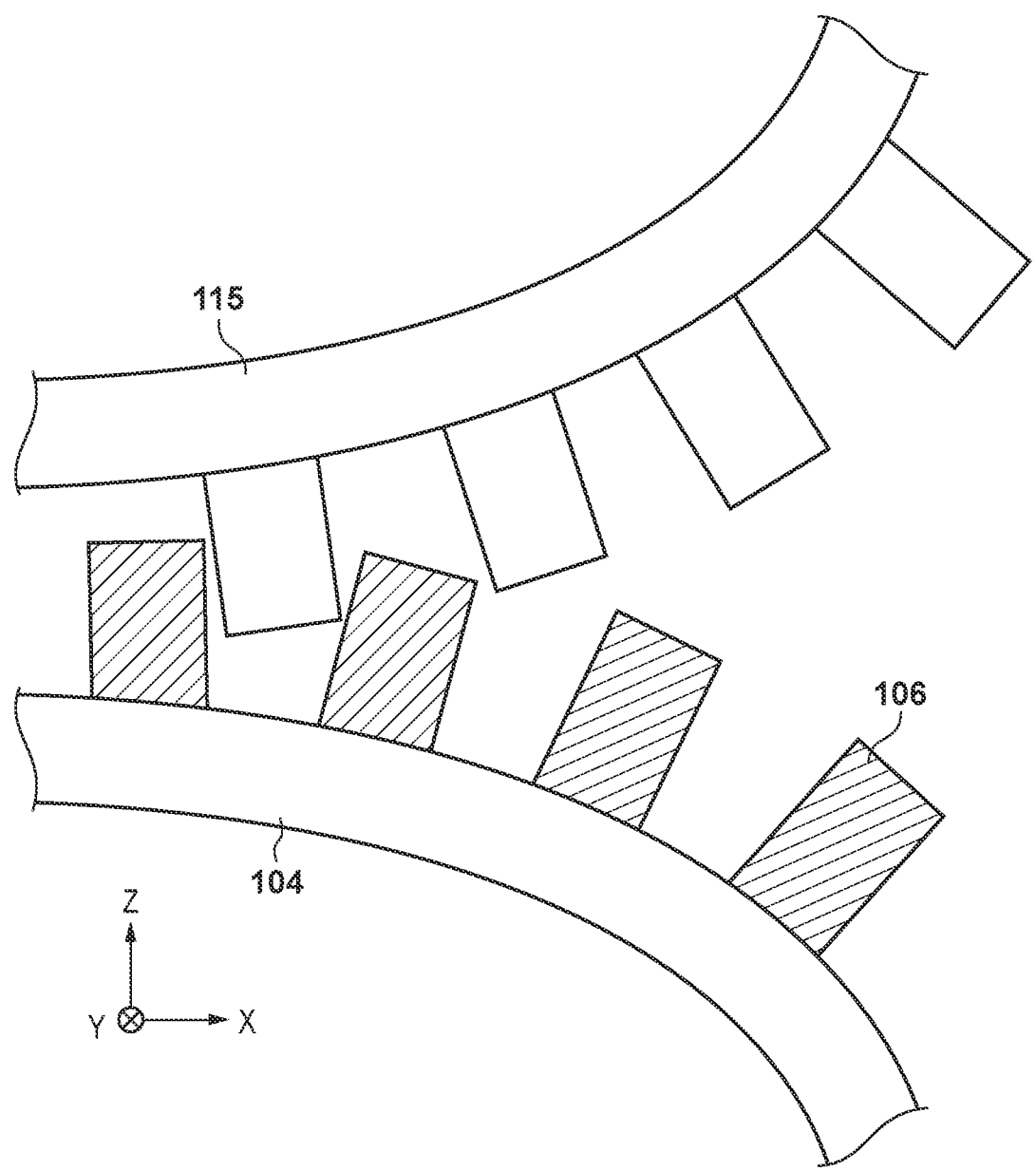
FIG. 5 is a view for explaining how a substrate is deformed at the time of mold separation.

In contrast to this, as shown in FIG. 5, reducing the chucking force on the substrate 104 at the contact region between the imprint material 106 and the pattern portion 115 compared with the chucking force at the surrounding portion will float the substrate 104 at the contact region and deform the substrate in the Z direction in accordance with the separation force. This can reduce the shift of the contact point between the imprint material 106 and the pattern portion 115 in the X-Y direction. A technique of making the difference in chucking force between the contact region between the imprint material 106 and the pattern portion 115 and the surrounding region is a conventional technique for preventing pattern breakage.

The problem in this case will be described next with reference to FIG. 6.

In a state 6a, the shot region 201 (see FIG. 3) is located inside the first chucking region 1021. With respect to the shot region 201, the chucking force controller 103 increases the chucking force at any of the second chucking region 1022 to the fifth chucking region 1025 which is a surrounding region of the first chucking region 1021 as compared with the chucking force at the first chucking region 1021 which is the contact region between the imprint material 106 and the pattern portion 115. This can deform the substrate 104 in the Z direction at the time of mold separation.

A state 6b indicates the contact region between the imprint material 106 and the pattern portion 115 at the start of mold separation under a chucking condition that causes such deformation of the substrate 104 in the Z direction. The image obtainer 114 can capture an image of such a contact region. In the state 6b, the center of the pattern portion 115 coincides with the centroid of the contact region. A state 6c indicates the contact region between the imprint material 106 and the pattern portion 115 immediate before the completion of mold separation, that is, a point (final mold separation point) at which the mold finally separates the imprint material. As in the state 6b, the center of the pattern portion 115 coincides with the centroid of the contact region.

In a state 6d, the shot region 202 (see FIG. 3) is located in a place straddling the second chucking region 1022, the third chucking region 1023, the fourth chucking region 1024, and the fifth chucking region 1025. The chucking force controller 103 performs the following control concerning the shot region 202. First of all, in order to prevent an end portion of the substrate 104 from floating and prevent the substrate 104 from separating from the substrate holder 102, the chucking force of the fifth chucking region 1025 is set to a chucking force larger than that of at least the contact region. In addition, the chucking force of the first chucking region 1021 that does not overlap the shot region 202 is set to a chucking force larger than that of at least the contact region. On the other hand, the chucking forces of the second chucking region 1022, the third chucking region 1023, and the fourth chucking region 1024 that overlap the shot region 202 should be set to chucking forces smaller than the chucking forces of the first chucking region 1021 and the fifth chucking region 1025. Note, however, that the chucking forces of the second chucking region 1022, the third chucking region 1023, and the fourth chucking region 1024 need not be equal to each other. For example, the chucking force of only a chucking region whose area dominantly occupies the area of a contact region may be weakened or the chucking force of a chucking region nearest to the central portion of the plane coordinates of the pattern portion 115 may be weakened.

The state 6d indicates the contact region between the imprint material 106 and the pattern portion 115 at the start of mold separation under a chucking condition that causes deformation of the substrate 104 in the Z direction. Because the chucking force of the fifth chucking region 1025 inside the contact region is larger than that of the second chucking region 1022 to the fourth chucking region 1024, the degree of deformation of the substrate 104 in the Z direction is unbalanced, and the center of the pattern portion 115 does not coincide with the centroid of the contract region. A state 6f indicates a contact region (final mold separation point) between the imprint material 106 and the pattern portion 115 immediately before the completion of mold separation. The contact region in the state 6f is more unbalanced than the contact region in a state 6e. That is, the distance between the center of the pattern portion 115 and the centroid of the contact region further increases.

Figure 6:
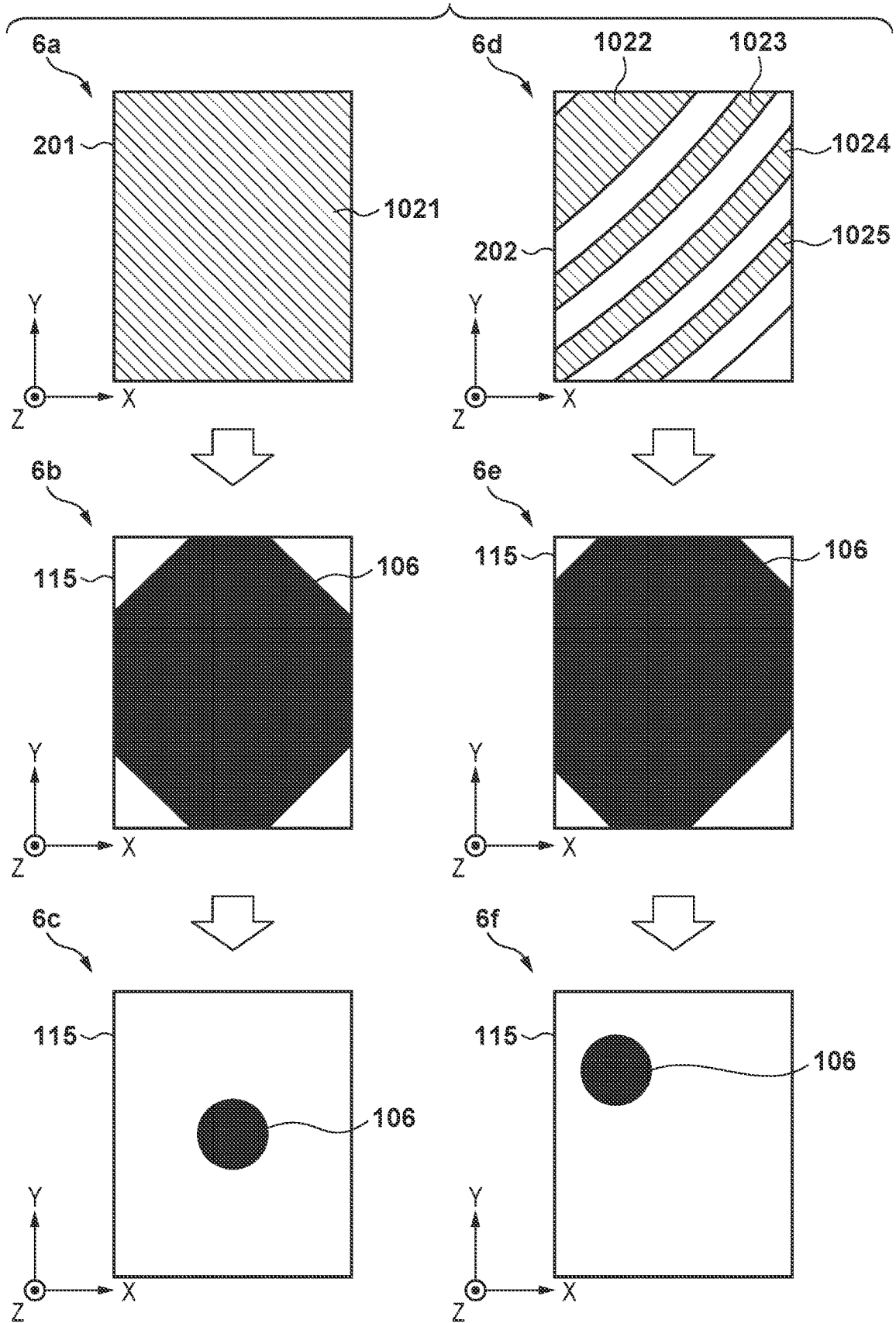
FIG. 6 is a view for explaining how a final mold separation point is decentered.
Figure 7:
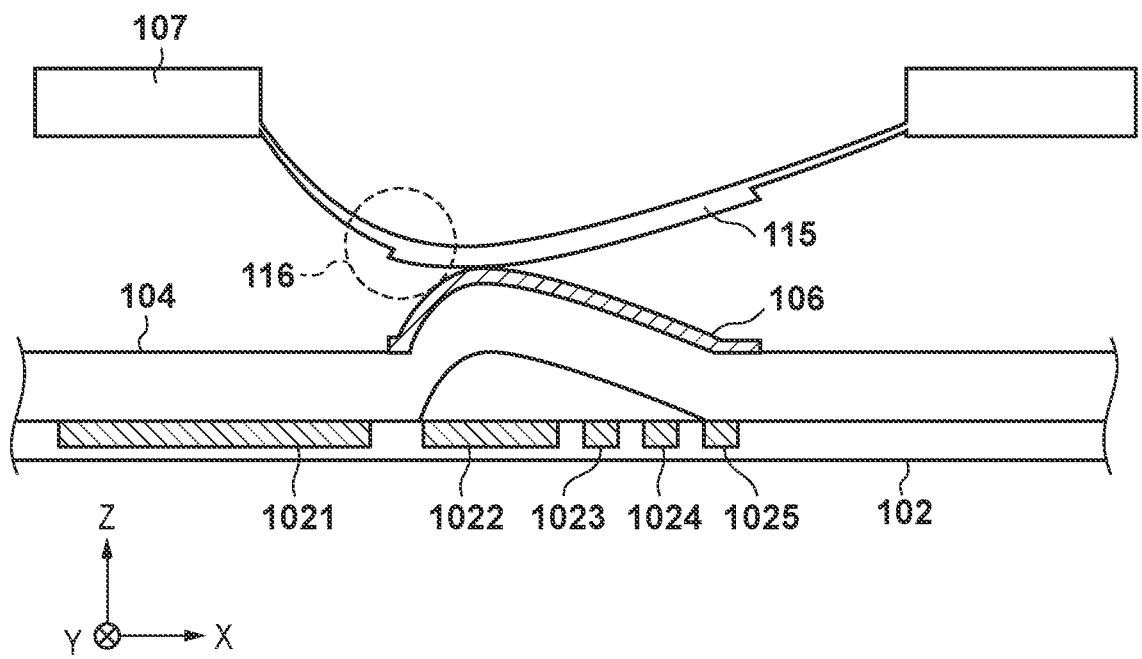
FIG. 7 is a view for explaining how a final mold separation point is decentered.

FIG. 7 shows the state 6f in FIG. 6 when viewed from the driving direction (a direction parallel to an X-Y plane) of the stage 101. Because the chucking forces of the chucking regions inside the contact region differ from each other, the final mold separation point of the pattern portion 115 is shifted from the center of the pattern portion 115. The distorted shape of the mold 107 at this time is disproportionally largely curved toward the center of the substrate 104. This causes larger stress in a region 116 where stress occurs in the mold 107 than in a normal shot region that does not straddle chucking regions like the shot region 201. The stress generated at this time sometimes causes the breakage of the mold 107, in particular the pattern portion 115.

The above problem occurs in the shot region 202 straddling a plurality of chucking regions in the existing technology.

Figure 8:
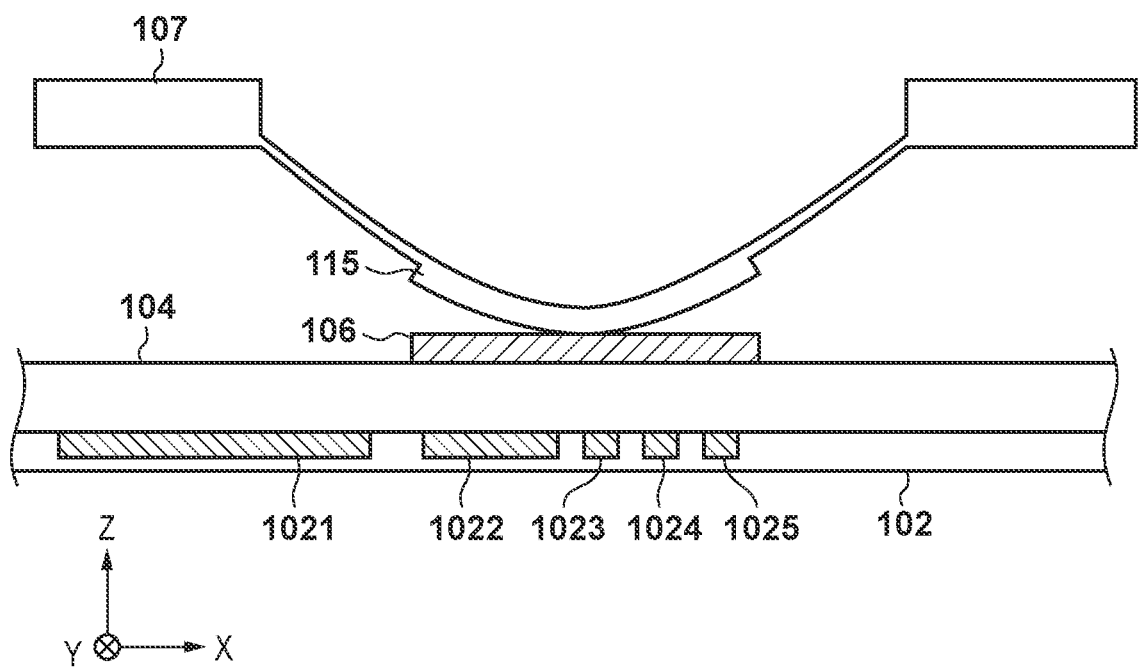
FIG. 8 is a view for explaining a method of preventing a final mold separation from being decentered.

FIG. 8 shows an example of the deformation of the mold 107 when the stress exerted on the mold 107 in FIG. 7 is minimized and an example of the deformation of the substrate 104 that enables such deformation. Referring to FIG. 8, the substrate 104 has a shape conforming to the substrate holder 102. This can be implemented by eliminating the differences in chucking force among the second chucking region 1022 to the fifth chucking region 1025 in the contact region between the imprint material 106 and the pattern portion 115. This makes the mold 107 deform symmetrically with respect to the center of the pattern portion 115, thereby preventing the breakage of the mold 107, in particular the pattern portion 115.

The above has described the cause of the breakage of the pattern formed by the imprint material 106 and the pattern portion 115 and the countermeasures based on the existing technology, and also has described the cause of the breakage of the mold 107 caused by the stress generated at the time of mold separation due to the countermeasure. The present invention is a technique for preventing both such pattern breakage and mold breakage.

In the following description, a chucking force condition for a plurality of chucking regions of the substrate holder 102 at the start of a mold separation step will be referred to as a first chucking condition, and a chucking force condition for the plurality of chucking regions to which the first chucking condition is switched in the middle of the mold separation step will be referred to a second chucking condition. In this embodiment, the first chucking condition is set to allow a target shot region on the substrate 104 which faces the pattern portion 115 to deform in a convex shape with respect to the pattern portion 115 in order to prevent pattern breakage. The second chucking condition is set to eliminate the differences in chucking force among the respective chucking regions under a target shot region so as make a final mold separation point coincide with the center of the pattern portion 115 in order to prevent mold breakage.

FIGS. 9A to 9D each show an example of the change pattern of the first chucking condition and the second chucking condition. The first chucking condition and the second chucking condition each include the chucking force of at least one chucking region in the contact region between the imprint material 106 and the pattern portion 115 and the chucking force of at least one of the chucking regions in the surrounding region.

Figure 9A:
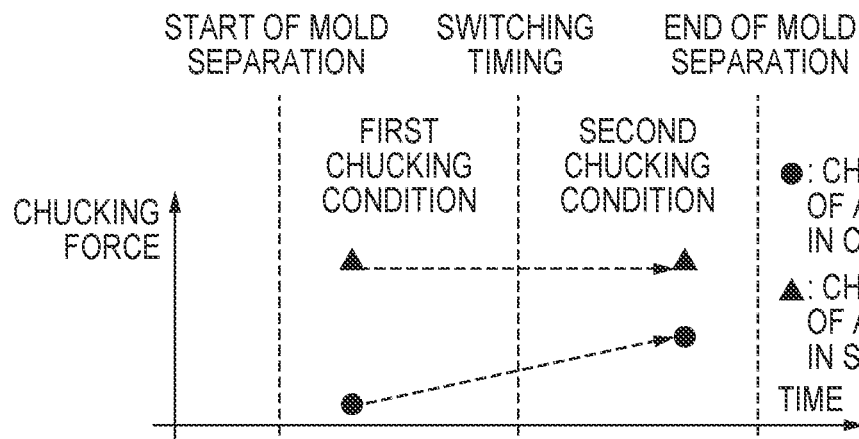
FIGS. 9A to 9D are graphs each showing an example of a change pattern of a first chucking condition and a second chucking condition.

Referring to FIG. 9A, according to the first chucking condition, the chucking force of at least a portion in the contact region is set to be smaller than that of at least a portion in the surrounding region so as to promote the deformation of the substrate 104 in order to prevent pattern breakage. According to the second chucking condition, the chucking force of at least a portion in the contact region, which has been kept small according to the first condition, is made to approach the chucking force of at least a portion in the surrounding region.

Figure 9B:
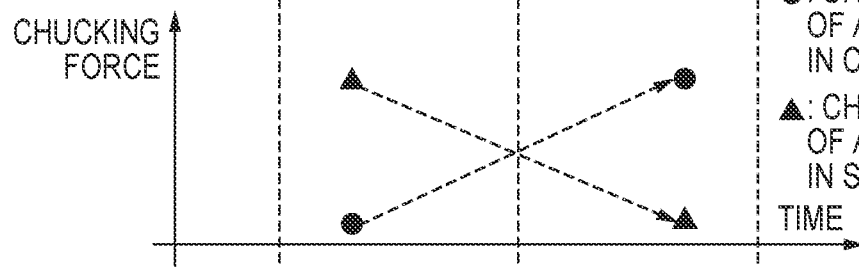

Referring to FIG. 9B, the magnitude relationship between the second chucking condition and the first chucking condition is reversed.

Figure 9C:
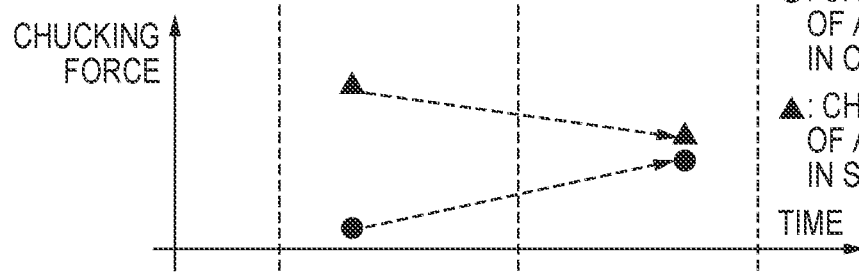

Referring to FIG. 9C, the second chucking condition makes the chucking forces of the above two portions approach each other.

Figure 9D:
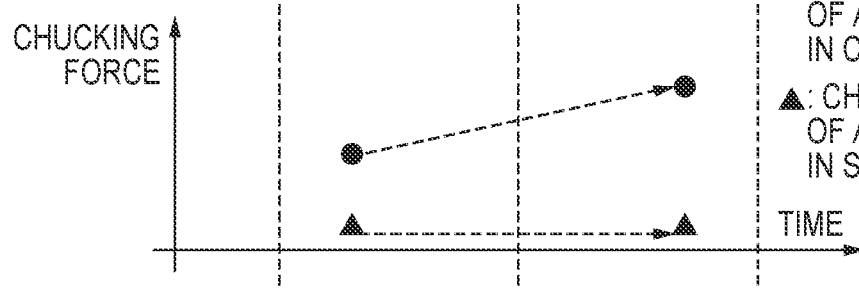

Referring to FIG. 9D, the chucking force of at least a portion in the surrounding region is kept smaller than that of at least a portion in the contact region, and the second chucking condition makes the chucking force of at least a portion in the contact region become larger than the chucking condition according to the first chucking condition.

Figure 10:
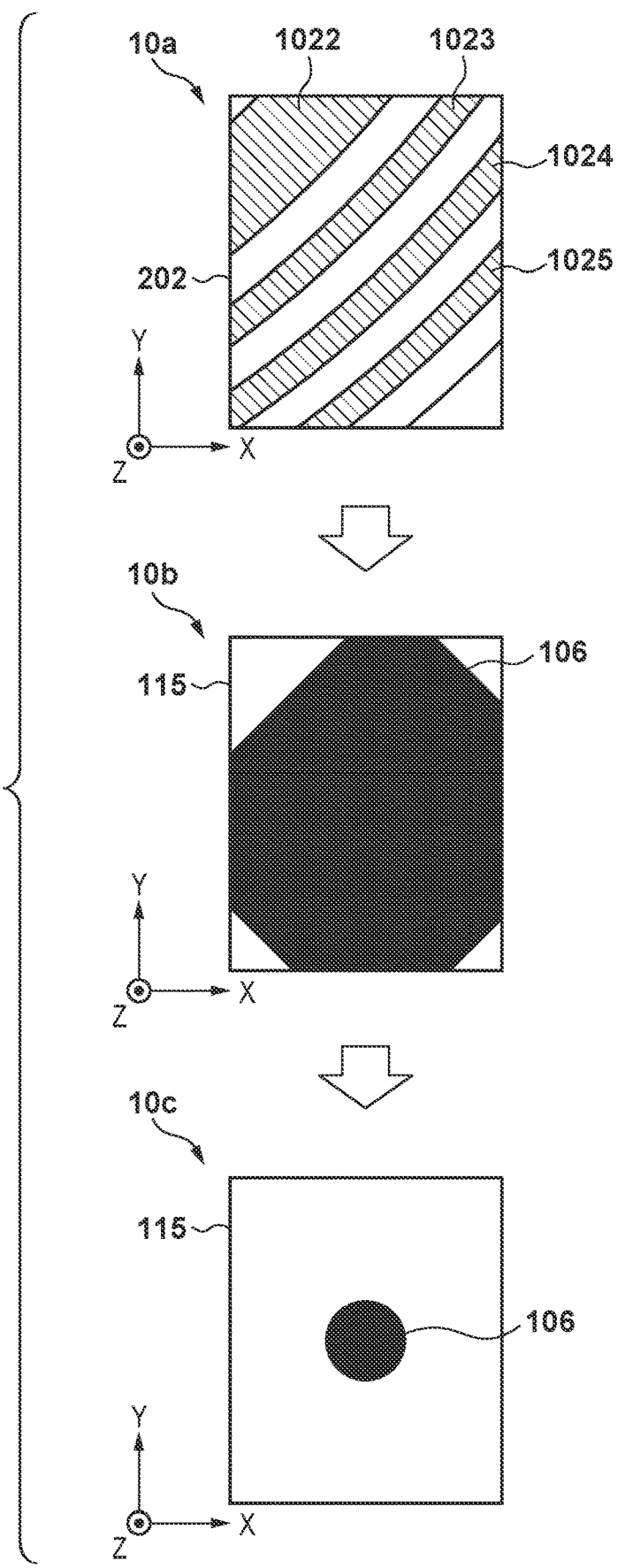
FIG. 10 is a view for explaining a method of preventing a final mold separation point from being decentered.

FIG. 10 shows an example of the transition of a chucking region when chucking condition control is performed at the time of mold separation as shown in FIGS. 9A to 9D. Referring to FIG. 10, a state 10a indicates the shot region 202 located in a place straddling the second chucking region 1022, the third chucking region 1023, the fourth chucking region 1024, and the fifth chucking region 1025. This state is the same as the stated in FIG. 6. The controller 113 sets, as the first chucking condition, a chucking condition that allows a target shot region facing the pattern surface to deform in a convex shape with respect to the pattern portion 115 (pattern surface) at the time of mold separation. More specifically, such a chucking condition is a chucking condition that weakens the chucking forces of chucking regions other than the chucking region, of the chucking regions under the target shot region, which is located nearest to the outer circumferential side of the substrate. A state 10b indicates the contact region between the imprint material 106 and the pattern portion 115 after the start of mold separation under the first chucking condition, that is, the chucking condition that allows the target shot region on the substrate 104 to deform in a convex shape with respect to the pattern portion 115 at the time of mold separation. At this point of time, as in the state 6e in FIG. 6, the degree of deformation of the substrate 104 is unbalanced, and the center of the pattern portion 115 may not coincide with the centroid of the contact region. In contrast to this, in this embodiment, the first chucking condition is changed to the second chucking condition in the middle of the mold separation step. This makes the final mold separation point coincide with the center of the pattern portion 115 in a state 10c.

Figure 11:
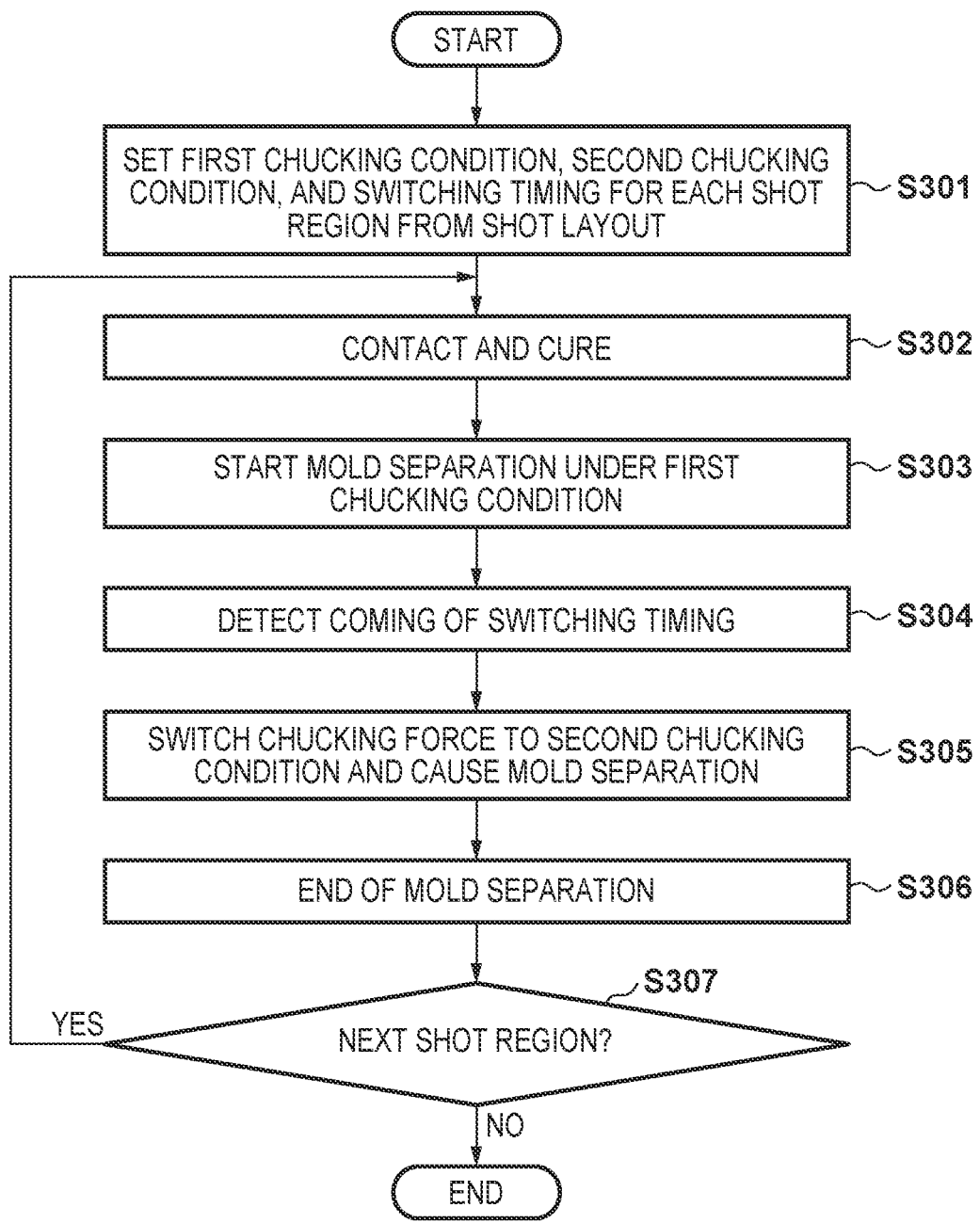
FIG. 11 is a flowchart of an imprint process.

FIG. 11 is a flowchart of an imprint process including mold separation using the first chucking condition and the second chucking condition in this embodiment. In step S301, the controller 113 sets a first chucking condition, a second chucking condition, and the switching timing between them for each shot region based on a shot layout. In step S302, the controller 113 controls the supplier 105 to supply an imprint material onto a substrate, controls the mold driver 109 to bring the mold 107 into contact with the imprint material 106 on the substrate 104, and controls the irradiator 111 to cure the imprint material.

In step S303, the controller 113 controls the mold driver 109 to start mold separation under the first chucking condition. In step S304, the controller 113 detects the coming of a switching timing in the middle of mold separation. In step S305, the controller 113 switches the chucking force to the second chucking condition and makes the mold separation progress. In step S306, the mold separation is completed. In step S307, the controller 113 determines whether there is any next shot region to be processed. If there is any next shot region, the process returns to step S302 to execute an imprint process for the next shot region. If there is no next shot region, this processing is terminated.

According to this flowchart, the proper values of the first chucking condition, the second chucking condition, and the switching timing between them are determined in advance, and the corresponding settings are assigned to each shot region in advance (for example, in step S301).

Note that the first chucking condition, the second chucking condition, and the switching timing between them can be determined for the shot region 201, which does not straddle chucking regions, as well as the shot region 202, which straddles a plurality of chucking regions.

Second Embodiment

Figure 12:
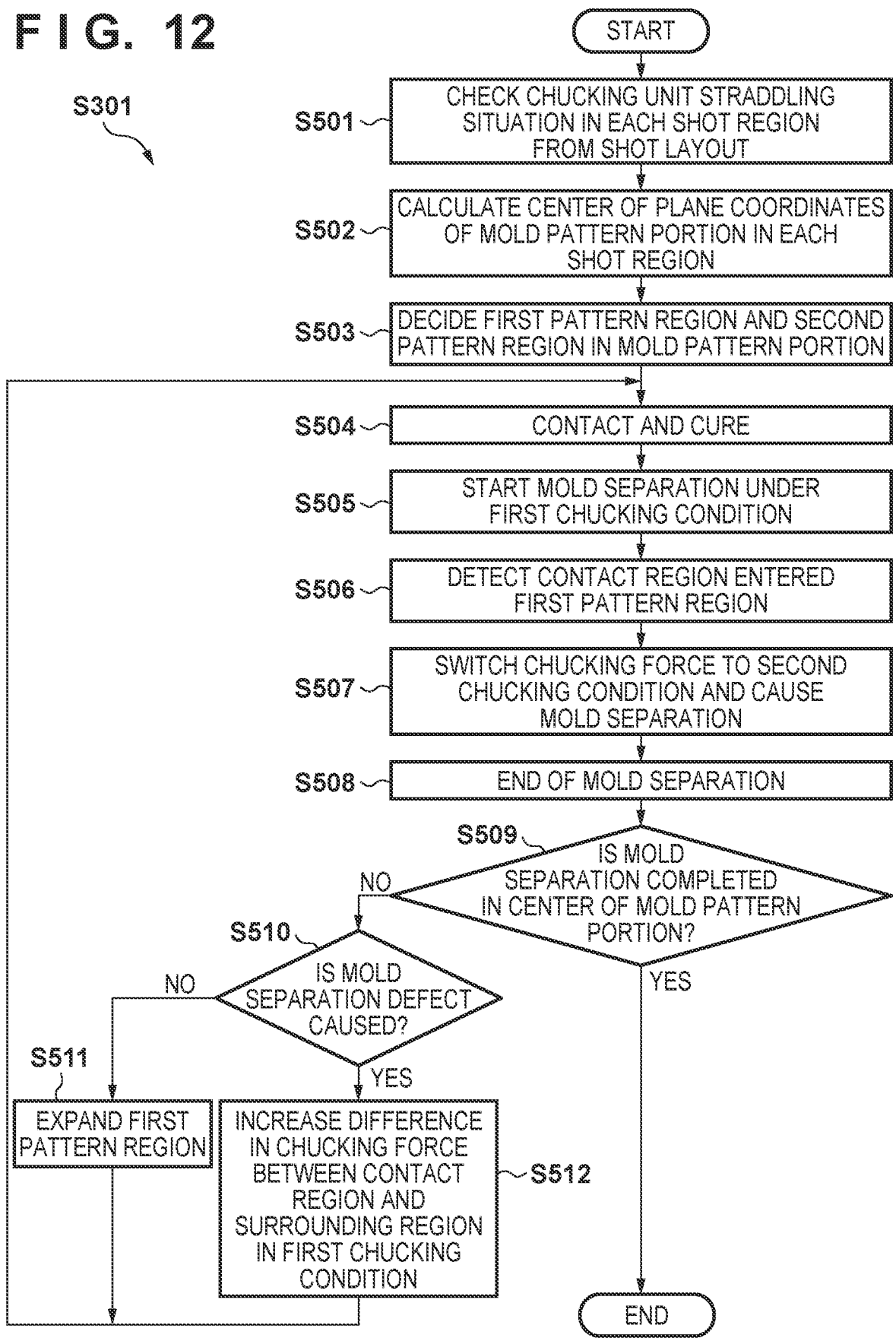
FIG. 12 is a flowchart of a method of deciding a first chucking condition, a second chucking condition, and the switching timing between them.

A specific method of deciding a first chucking condition, a second chucking condition, and the switching timing between them in step S301 in FIG. 11 will be described below. FIG. 12 is a flowchart of a specific method of deciding a first chucking condition, a second chucking condition, and the timing of changing from the first chucking condition to the second chucking condition (to be referred to as the "switching timing" hereinafter) in step S301.

In step S501, a controller 113 checks, from the shot layout of a substrate 104, which of a first chucking region 1021 to a fifth chucking region 1025 of a substrate holder 102 is present in each shot region. The controller 113 then decides a first chucking condition and a second chucking condition based on the area of a shot region which is occupied by each chucking region or a specific chucking region nearest to the center of a pattern portion 115. If the switching timing is too early, the movement of a substrate in the Z direction is restricted from an early stage of a mold separation step, resulting in an increase in the risk of pattern breakage. In contrast to this, if the switching timing is too late, the final mold separation point cannot be made to accurately approach the center of the pattern portion 115 in time before the completion of mold separation. Accordingly, in the following processing, a switching timing may be decided to be a possibly early timing within the range in which no pattern breakage occurs.

Figure 13:
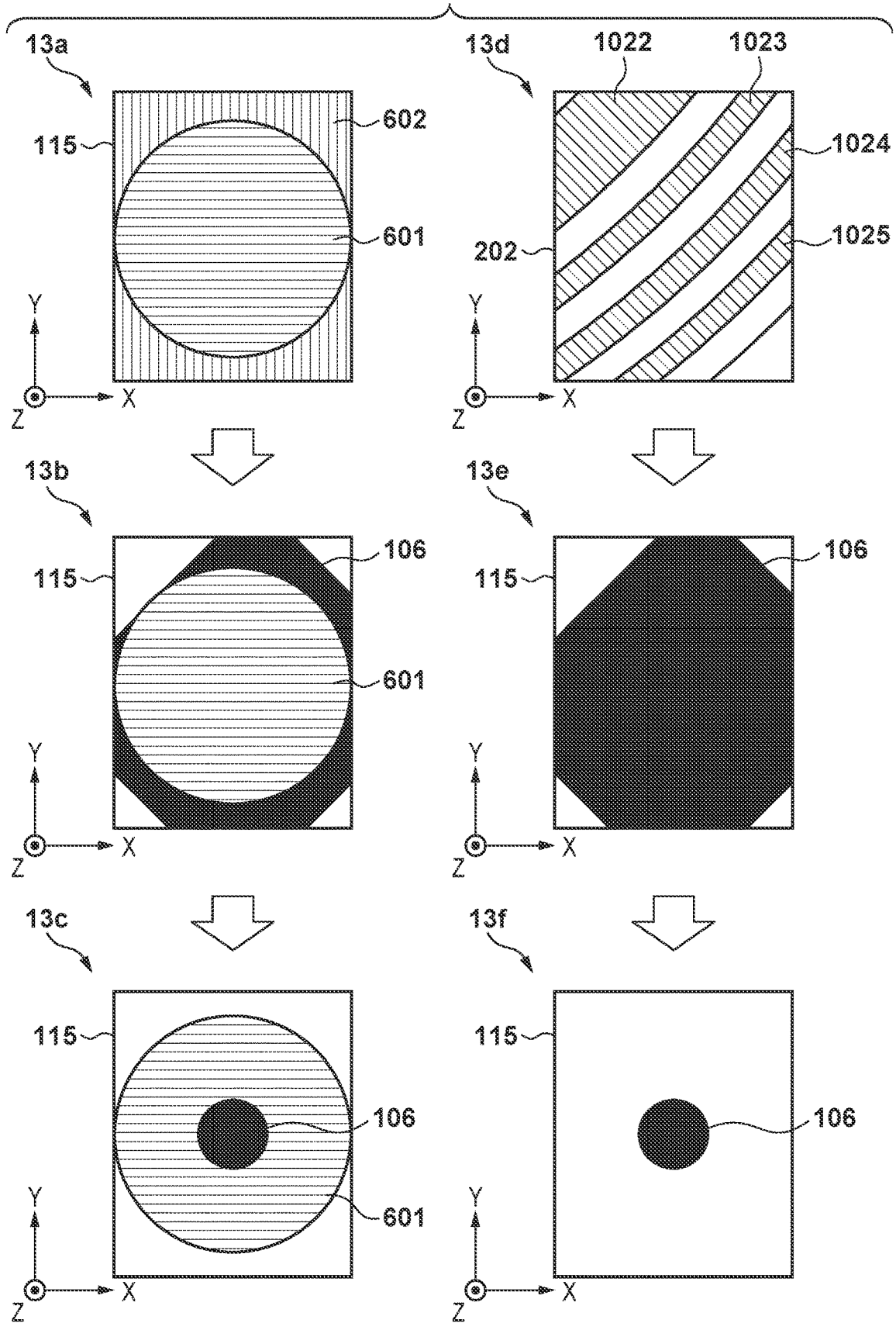
FIG. 13 is a view for explaining the method of deciding a first chucking condition, a second chucking condition, and the switching timing between them.

In step S502, the controller 113 obtains the central coordinates of the pattern portion 115 and sets coordinates to be a final mold separation point in each shot region. FIG. 13 shows the contact state between the imprint material on a shot region and the pattern portion 115 of a mold 107 during mold separation. Referring to FIG. 13, a state 13a indicates an example of the segmentation of the pattern portion 115 into a first pattern region 601 and a second pattern region 602. In this embodiment, it is aimed that a contact region starts as a region including the outer circumference portion of the pattern portion 115 at the start of mold separation, and disappears at the center of the pattern portion 115 at the end of mold separation. Accordingly, a reference region is defined to make the centroid of the first pattern region 601 coincide with the center of the pattern portion 115. In step S503, the controller 113 decides the first pattern region 601 and the second pattern region 602 in the pattern portion 115 so as to determine whether to switch between the first chucking condition and the second chucking condition. For example, as the first pattern region 601 (reference region), a region that includes the center of the pattern surface and is smaller than the pattern surface is decided. The second pattern region 602 is a region, of the pattern surface, which excludes the first pattern region 601.

In step S504, the controller 113 controls a supplier 105 to supply an imprint material onto a substrate, controls a mold driver 109 to bring the mold 107 into contact with the imprint material 106 on the substrate 104, and controls an irradiator 111 to cure the imprint material. In step S505, the controller 113 controls the mold driver 109 to start mold separation under the first chucking condition decided in step S501. In step S506, the controller 113 detects that the image obtained by an image obtainer 114 has entered the first pattern region 601 decided in step S503. A state 13*b* in FIG. 13 indicates an example of an image when it is detected that at least a portion of the outer edge of the contact region has entered the first pattern region 601 in step S506. The timing when it is detected that at least a portion of the outer edge of the contract region has entered the first pattern region 601 in step S506 is decided as a switching timing.

In step S507, the controller 113 proceeds with the mold separation by switching the chucking force to the second chucking condition decided in step S501. The mold separation is completed in step S508. Although the mold separation is continued during steps S505 to S508, the mold separation can be temporally stopped in each of steps S505, S506, S507, and S508. In step S509, the controller 113 determines, based on the image obtained by the image obtainer 114 immediately before the completion of the mold separation, whether the final mold separation point coincides with the coordinates decided in step S502, that is, the center of the pattern portion 115. If YES in step S509, a first chucking condition, a second chucking condition, and the switching timing between them are decided for a shot region. If NO in step S509, the process advances to step S510, in which the controller 113 checks whether breakage (mold separation defect) of the formed pattern is caused by the mold separation, by using the image obtained by the image obtainer 114 or an external measurement device. If pattern breakage has occurred, the first chucking condition is changed in step S512 to a chucking condition that increases the difference in chucking force between the contact region and the surrounding region so as to increase the amount of deformation of the substrate during mold separation in order to prevent pattern breakage. The process then returns to step S504. If no pattern breakage has occurred, the process advances to step S511. In this situation, although no pattern breakage has occurred, the final mold separation point is shifted from the center of the pattern portion 115 (NO in step S509), and hence there is a high risk of mold breakage. For this reason, in step S511, the area of the first pattern region 601 is expanded, and the process returns to step S504 again. Expanding the area of the first pattern region 601 can quicken the switching timing from the first chucking condition to the second chucking condition (the execution timing of step S507). This can make the final mold separation point approach the center of the pattern portion 115. A state 13*c* in FIG. 13 indicates an example of an image when the final mold separation point coincides with the center of the pattern portion 115 in step S509 through the above process.

As described above, the controller 113 sets a first pattern region (reference region) so as to prevent the occurrence of a defect in a formed pattern and make the final mold separation point coincide with the center of the pattern portion 115 based on the image captured by the image obtainer 114 immediately before the completion of the mold separation.

In step S301, a first chucking condition, a second chucking condition, and the switching timing between them can be properly decided for each shot region by the above procedure. Note that the decision procedure shown in FIG. 12 may be used for an imprint process without any change. Like the state 6*d* in FIG. 6, a state 13*d* in FIG. 13 indicates the shot region 202 located in a place straddling the second chucking region 1022, the third chucking region 1023, the fourth chucking region 1024, and the fifth chucking region 1025. A state 13*e* in FIG. 13 indicates the contact region between the imprint material 106 and the pattern portion 115 after the start of mold separation under the first chucking condition decided according to the procedure shown in FIG. 12. At this point of time, as in the state 6*e* in FIG. 6, the degree of deformation of the substrate 104 is unbalanced. This may make the center of the pattern portion 115 not coincide with the centroid of the contact region. In a state 13*f* in FIG. 13, because the first chucking condition is switched to the second chucking condition at the timing properly set according to the procedure shown in FIG. 12, the final mold separation point coincides with the center of the pattern portion 115.

Note that a first chucking condition, a second chucking condition, and the switching timing between them can be decided for not only a shot region 202 that straddles a plurality of chucking regions but also a shot region 201 that does not straddle chucking regions following the same concept.

Third Embodiment

Another example of a method of deciding a first chucking condition, a second chucking condition, and the switching timing between them in step S301 in FIG. 11 will be described below.

As shown in FIG. 1, an imprint apparatus 100 according to this embodiment includes a measurement device 150 arranged near a mold holder 108. The measurement device 150 measures a physical amount concerning separation force that is the force required to separate a cured imprint material 106 from a mold 107 in a mold separation step. The measurement device 150 can be, for example, a load cell including a strain body that deforms in proportion to force and a strain gauge that measures the amount of deformation of the strain body.

Figure 14:
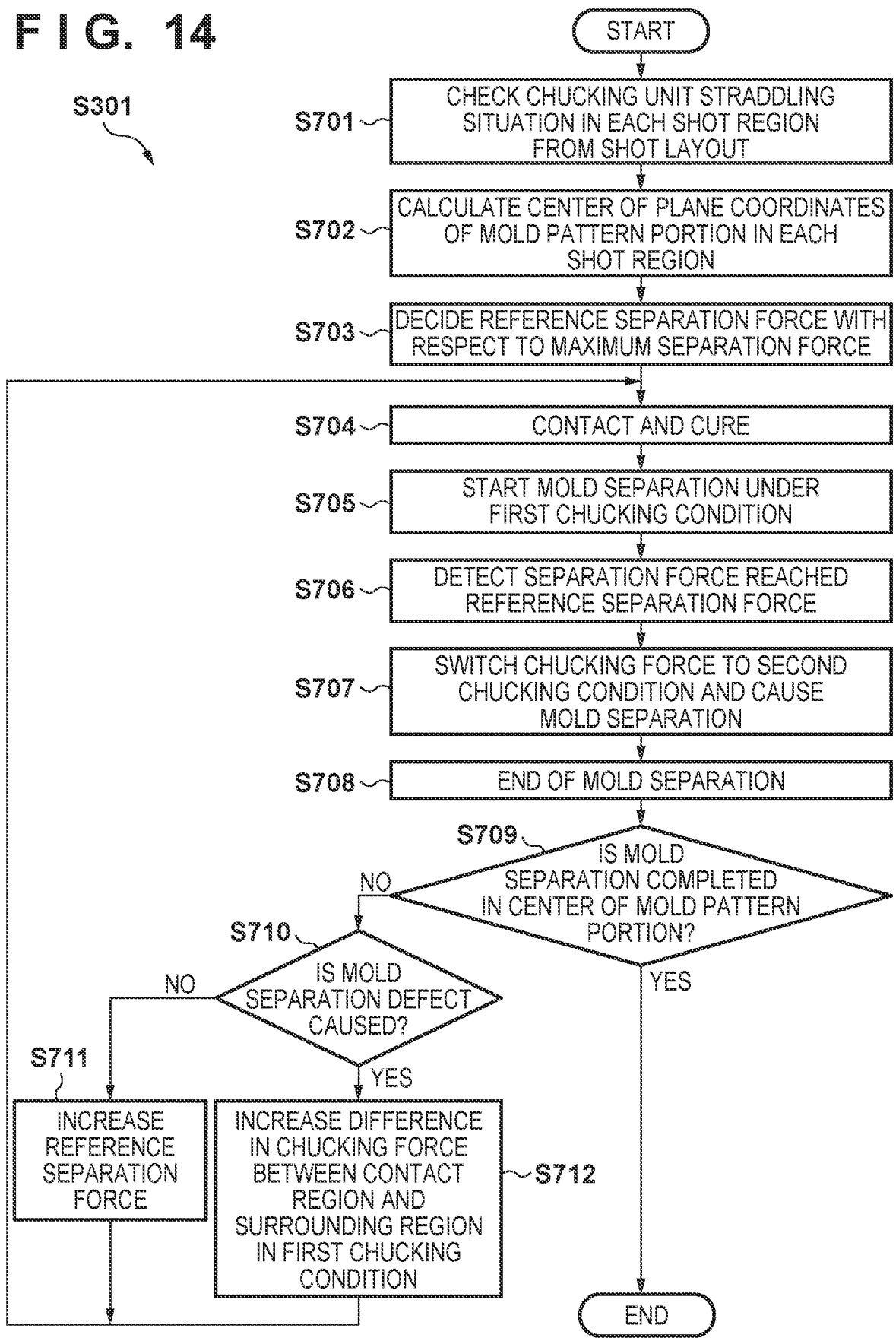
FIG. 14 is a flowchart of a method of deciding a first chucking condition, a second chucking condition, and the switching timing between them.

FIG. 14 is a flowchart of a specific method of deciding a first chucking condition, a second chucking condition, and the switching timing between them in step S301 according to this embodiment.

In step S701, a controller 113 checks, from the shot layout of a substrate 104, which of a first chucking region 1021 to a fifth chucking region 1025 of a substrate holder 102 is present in each shot region. The controller 113 decides the first chucking condition and the second chucking condition based on the area of a shot region which is occupied by each chucking region or a specific chucking region nearest to the center of a pattern portion 115.

Figure 15A:
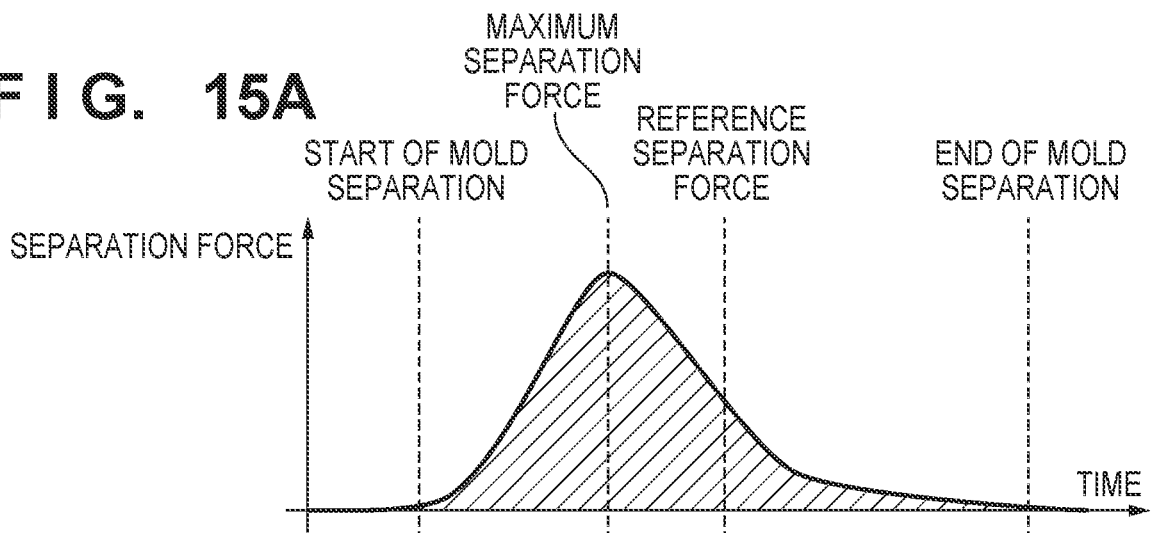
FIGS. 15A to 15C are graphs for explaining a method of deciding a reference separation force.

In step S702, the controller 113 obtains the central coordinates of the pattern portion 115 and sets coordinates to be a final mold separation point in each shot region. In step S703, the controller 113 decides a reference separation force with respect to the maximum separation force generated at the time of mold separation in order to determine switching between the first chucking condition and the second chucking condition by using the measurement device 150. This reference separation force may be either an absolute value or a relative change amount or relative ratio with respect to the maximum separation force. FIG. 15A shows an example of deciding a reference separation force when a point at which the separation force begins to increase from the start of mold separation and decreases first is set as the maximum separation force. In this embodiment, the separation force reaches a peak only once. Depending on control by the mold driver 109, however, the separation force sometimes has a plurality of peaks. In this case, a reference separation force may be decided based on, for example, the relationship between the peaks.

In step S704, the controller 113 controls a supplier 105 to supply an imprint material onto a substrate, controls a mold driver 109 to bring the mold 107 into contact with an imprint material 106 on the substrate 104, and controls an irradiator 111 to cure the imprint material. In step S705, the controller 113 controls the mold driver 109 to start mold separation under the first chucking condition decided in step S701. In step S706, the controller 113 detects that the separation force measured by the measurement device 150 has reached the reference separation force. This detected timing is decided as a switching timing.

Figure 15B:
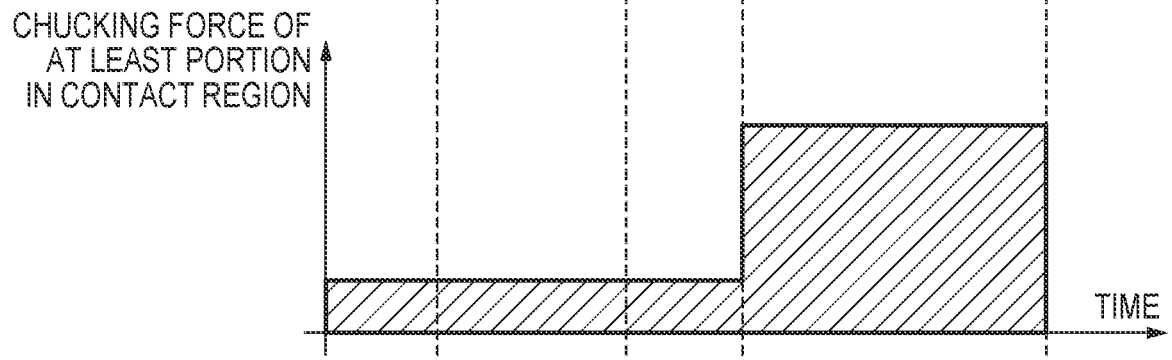
Figure 15C:
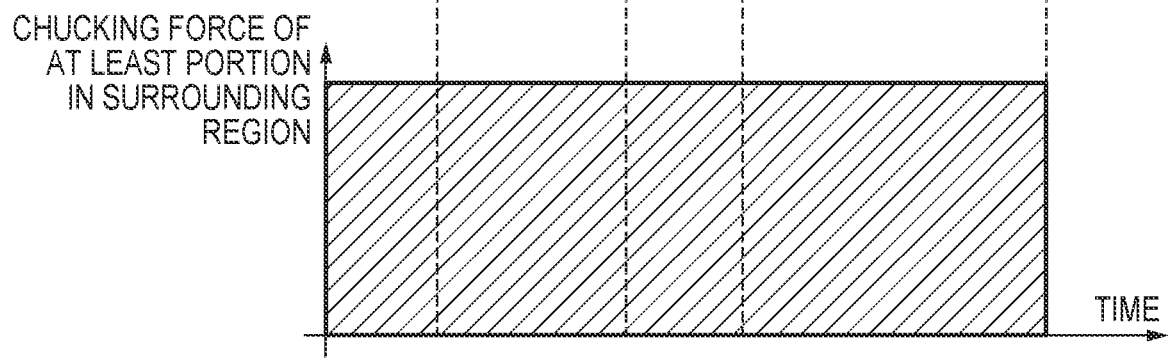

In step S707, the controller 113 proceeds with the mold separation by switching the chucking force to the second chucking condition decided in step S701. The mold separation is completed in step S708. FIGS. 15B and 15C each show an example of switching between the chucking force of at least a portion in the contact region and the chucking force of at least a portion in the surrounding region during steps S705 to S708. Although the mold separation is continued during steps S705 to S708, the mold separation can be temporally stopped in each of steps S705, S706, S707, and S708. In step S709, the controller 113 determines, based on the image obtained by an image obtainer 114, whether the final mold separation point coincides with the coordinates decided in step S702, that is, the center of the pattern portion 115. If YES in step S709, a first chucking condition, a second chucking condition, and the switching timing between them are decided for a shot region. If NO in step S709, the process advances to step S710, in which the controller 113 checks whether the formed pattern has not broken, by using the image obtained by the image obtainer 114 or an external measurement device. If YES in step S710, the process advances to step S712 to increase the difference in chucking force between the contact region and the surrounding region under the first chucking condition, and returns to step S704. If NO in step S710, the process advances to step S711 to increase the reference separation force, and returns to step S704.

As described above, the controller 113 sets a reference separation force based on the image captured by the image obtainer 114 immediately before the completion of the mold separation so as to prevent the occurrence of a defect in a formed pattern and make the final mold separation point coincide with the center of the pattern portion 115.

In step S301, a first chucking condition, a second chucking condition, and the switching timing between them can be decided for each shot region by the above procedure. Note that the decision procedure shown in FIG. 14 may be used for an imprint process without any change.

Note that a first chucking condition, a second chucking condition, and the switching timing between them can be decided for not only a shot region 202 that straddles a plurality of chucking regions but also a shot region 201 that does not straddle chucking regions following the same concept.

Fourth Embodiment

Figure 16:
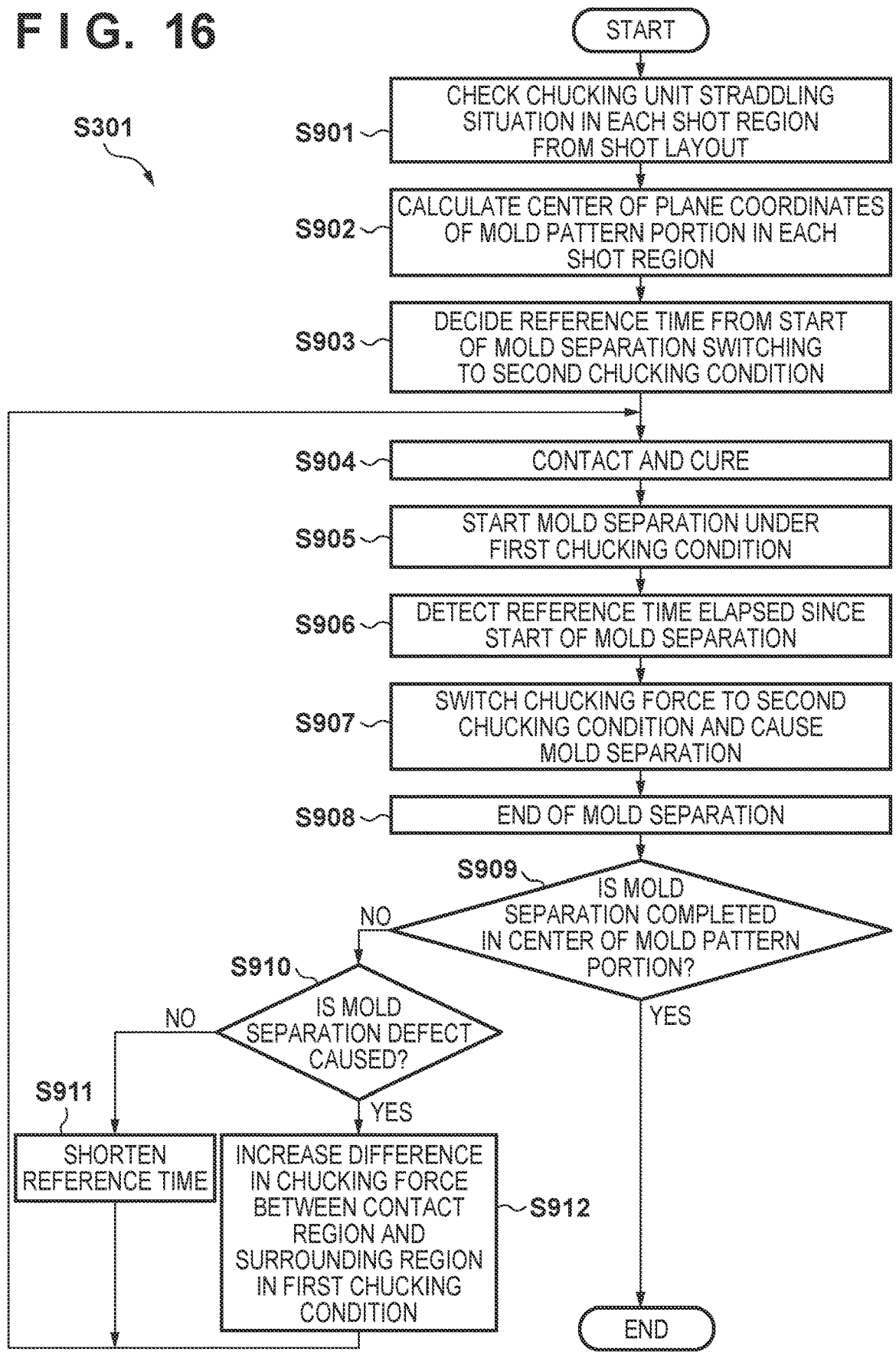
FIG. 16 is a flowchart of a method of deciding a first chucking condition, a second chucking condition, and the switching timing between them.

Still another example of a method of deciding a first chucking condition, a second chucking condition, and the switching timing between them in step S301 in FIG. 11 will be described below. FIG. 16 is a flowchart of a specific method of deciding a first chucking condition, a second chucking condition, and the switching timing between them in step S301 according to this embodiment.

In step S901, a controller 113 checks, from the shot layout of a substrate 104, which of a first chucking region 1021 to a fifth chucking region 1025 of a substrate holder 102 is present in each shot region. The controller 113 decides a first chucking condition and a second chucking condition based on the area of a shot region which is occupied by each chucking region or a specific chucking region nearest to the center of a pattern portion 115.

In step S902, the controller 113 obtains the central coordinates of the pattern portion 115 and sets coordinates to be a final mold separation point in each shot region. In step S903, the controller 113 decides a reference time from the start of mold separation, in which the first chucking condition is switched to the second chucking condition.

In step S904, the controller 113 controls a supplier 105 to supply an imprint material onto a substrate, controls a mold driver 109 to bring a mold 107 into contact with an imprint material 106 on the substrate 104, and controls an irradiator 111 to cure the imprint material. In step S905, the controller 113 controls the mold driver 109 to start a mold separation step under the first chucking condition decided in step S901. In step S906, the controller 113 detects that the reference time has elapsed since the start of the mold separation step. This detected timing is decided as a switching timing.

In step S907, the controller 113 proceeds with the mold separation by switching the chucking force to the second chucking condition decided in step S901. The mold separation is completed in step S908. Although the mold separation is continued during steps S905 to S908, the mold separation can be temporally stopped in each of steps S905, S906, S907, and S908. In step S909, the controller 113 determines, based on the image obtained by an image obtainer 114, whether the final mold separation point coincides with the coordinates decided in step S902, that is, the center of the pattern portion 115. If YES in step S909, a first chucking condition, a second chucking condition, and the switching timing between them are decided for a shot region. If NO in step S909, the process advances to step S910, in which the controller 113 checks whether the formed pattern has not broken, by using the image obtained by the image obtainer 114 or an external measurement device. If YES in step S910, the process advances to step S912 to increase the difference in chucking force between the contact region and the surrounding region under the first chucking condition, and returns to step S904. If NO in step S910, the process advances to step S911 to shorten the reference time, and returns to step S904.

As described above, the controller 113 sets a reference time based on the image captured by the image obtainer 114 immediately before the completion of the mold separation so as to prevent the occurrence of a defect in a formed pattern and make the final mold separation point coincide with the center of the pattern portion 115.

In step S301, a first chucking condition, a second chucking condition, and the switching timing between them can be decided for each shot region by the above procedure. Note that the decision procedure shown in FIG. 16 may be used for an imprint process without any change.

Note that a first chucking condition, a second chucking condition, and the switching timing between them can be decided for not only a shot region 202 that straddles a plurality of chucking regions but also a shot region 201 that does not straddle chucking regions following the same concept.

Fifth Embodiment

Figure 17:
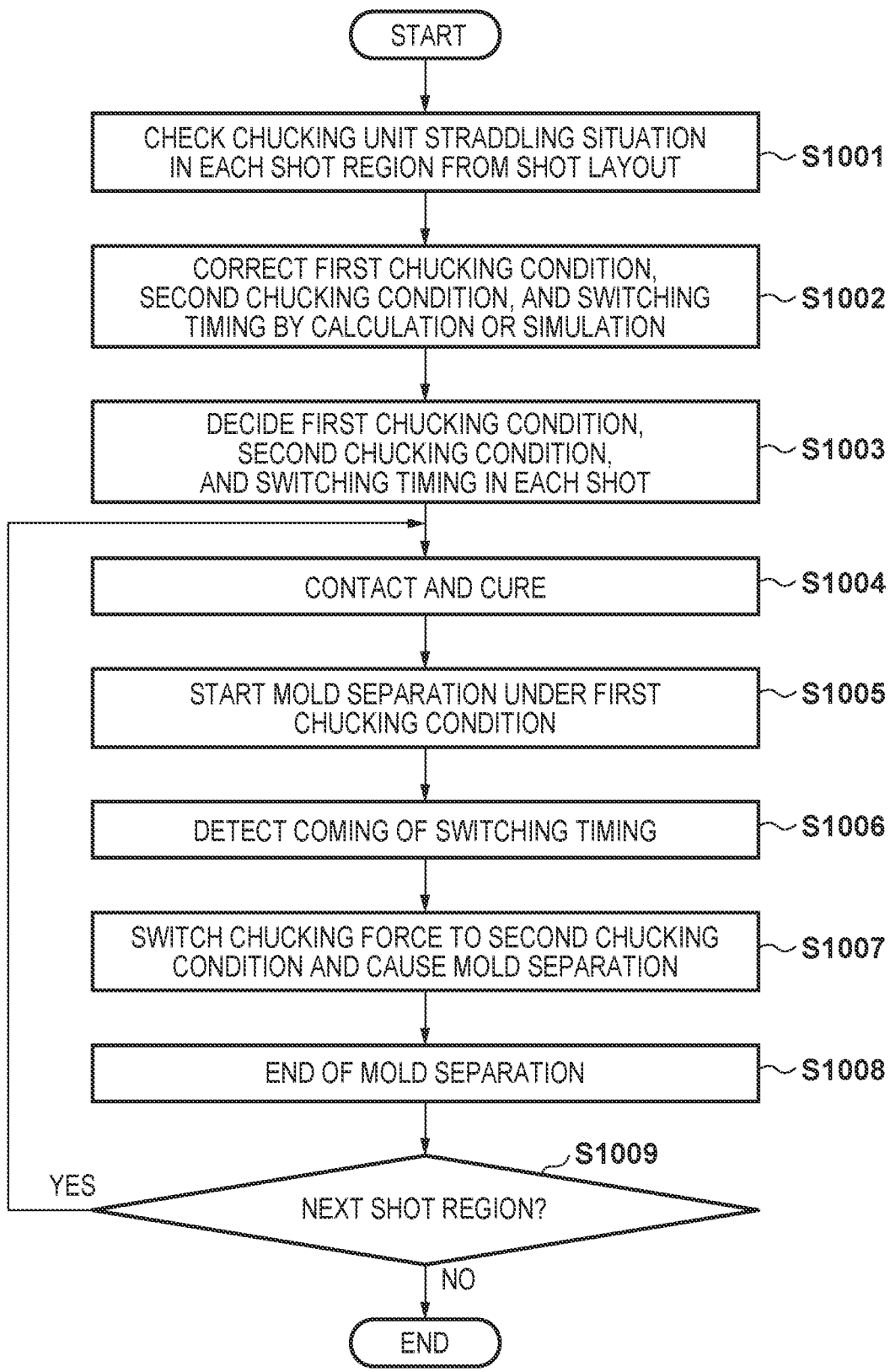
FIG. 17 is a flowchart of an imprint process.

This embodiment relates to a modification of the imprint process in FIG. 11 according to the first embodiment. FIG. 17 is a flowchart of the imprint process according to the fifth embodiment.

In step S1001, a controller 113 checks, from the shot layout of a substrate 104, which of a first chucking region 1021 to a fifth chucking region 1025 of a substrate holder 102 is present in each shot region. The controller 113 decides a first chucking condition and a second chucking condition based on the area of a shot region which is occupied by each chucking region or a specific chucking region nearest to the center of a pattern portion 115.

In step S1002, the controller 113 determines by calculation or simulation whether the first chucking condition, the second chucking condition, and the switching timing between them decided in step S1001 are appropriate, and performs correction. In addition, this determination may include, for example, a learning function based on past performance information. In step S1003, the controller 113 decides a first chucking condition, a second chucking condition, and the switching timing between them.

In step S1004, the controller 113 controls a supplier 105 to supply an imprint material onto a substrate, controls a mold driver 109 to bring a mold 107 into contact with an imprint material 106 on a substrate 104, and controls an irradiator 111 to cure the imprint material. In step S1005, the controller 113 controls the mold driver 109 to start mold separation under the first chucking condition decided in step S1003.

In step S1006, the controller 113 detects that the timing decided in step S1003 has come. In step S1007, the controller 113 proceeds with the mold separation by switching the chucking force to the second chucking condition decided in step S1003. The mold separation is completed in step S1008.

Although the mold separation is continued during steps S1005 to S1008, the mold separation can be temporarily stopped in each of steps S1005, S1006, S1007, and S1008. In step S1009, the controller 113 determines whether there is a next shot region to be processed. If there is a next shot region, the process returns to step S1004 to execute an imprint process for the next shot region. If there is no next shot region, this processing is terminated.

Sixth Embodiment

Each embodiment described above has exemplified the imprint apparatus, as an aspect of a forming apparatus, which transfers the pattern of the mold onto an imprint material by bringing the imprint material into contact with the mold. However, the present invention can be applied to a planarization apparatus, as another aspect of the forming apparatus, which forms a planarized film made of a composition on a substrate by bringing the composition on the substrate into contact with a member (mold) having a planarized surface.

The underlying pattern on the substrate has a concave-convex profile derived from a pattern formed in a previous step. More particularly, a process substrate may have a step of about 100 nm in accordance with the advancement of the multilayer structure of memory elements in recent years. The step derived from the moderate undulation of the entire substrate can be corrected by a focus tracking function of a scan exposure apparatus used in a photo process. However, the fine concave-convex portions having a pitch small enough to fall within the exposure slit area of the exposure apparatus may fall outside the DOF (Depth Of Focus) of the exposure apparatus. As a conventional method of planarizing the underlying pattern of a substrate, a method of forming a planarized layer, such as SOC (Spin On Carbon) or CMP (Chemical Mechanical Polishing) is used. However, problematically, the conventional technique cannot obtain a sufficient planarization performance, and the concave-convex difference of the underlayer caused by multilayer formation tends to increase.

In order to solve this problem, studies have been conducted on a planarization apparatus that planarizes a substrate by using the above imprint technique. The planarization apparatus locally performs planarization within a substrate plane by bringing a planarized surface of a member or a member (flat template) on which no pattern is formed into contact with an uncured composition (planarization material) supplied to the substrate in advance. Subsequently, the composition is cured while the composition is in contact with the flat template, and the flat template is separated from the cured composition. This forms a planarized layer on the substrate. The planarization apparatus using the imprint technique is configured to drop a composition in drops in an amount corresponding to a stepped portion on a substrate, and hence is expected to improve the accuracy of planarization as compared with the existing methods.

<Embodiment of Method of Manufacturing Article>

The pattern of a cured product formed using an imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, a SRAM, a flash memory, and a MRAM and semiconductor elements such as an LSI, a CCD, an image sensor, and an FPGA. Examples of the mold are molds for imprint.

The pattern of the cured product is directly used as at least some of the constituent members of the above-described articles or used temporarily as a resist mask. After etching or ion implantation is performed in the substrate processing step, the resist mask is removed.

A method of manufacturing an article will be described next. As shown step SA of FIG. 19, a substrate 1z such as a silicon wafer with a processed material 2z such as an insulator formed on the surface is prepared. Next, an imprint material 3z is applied to the surface of the processed material 2z by an inkjet method or the like. A state in which the imprint material 3z is applied as a plurality of droplets onto the substrate is shown here.

Figure 19:
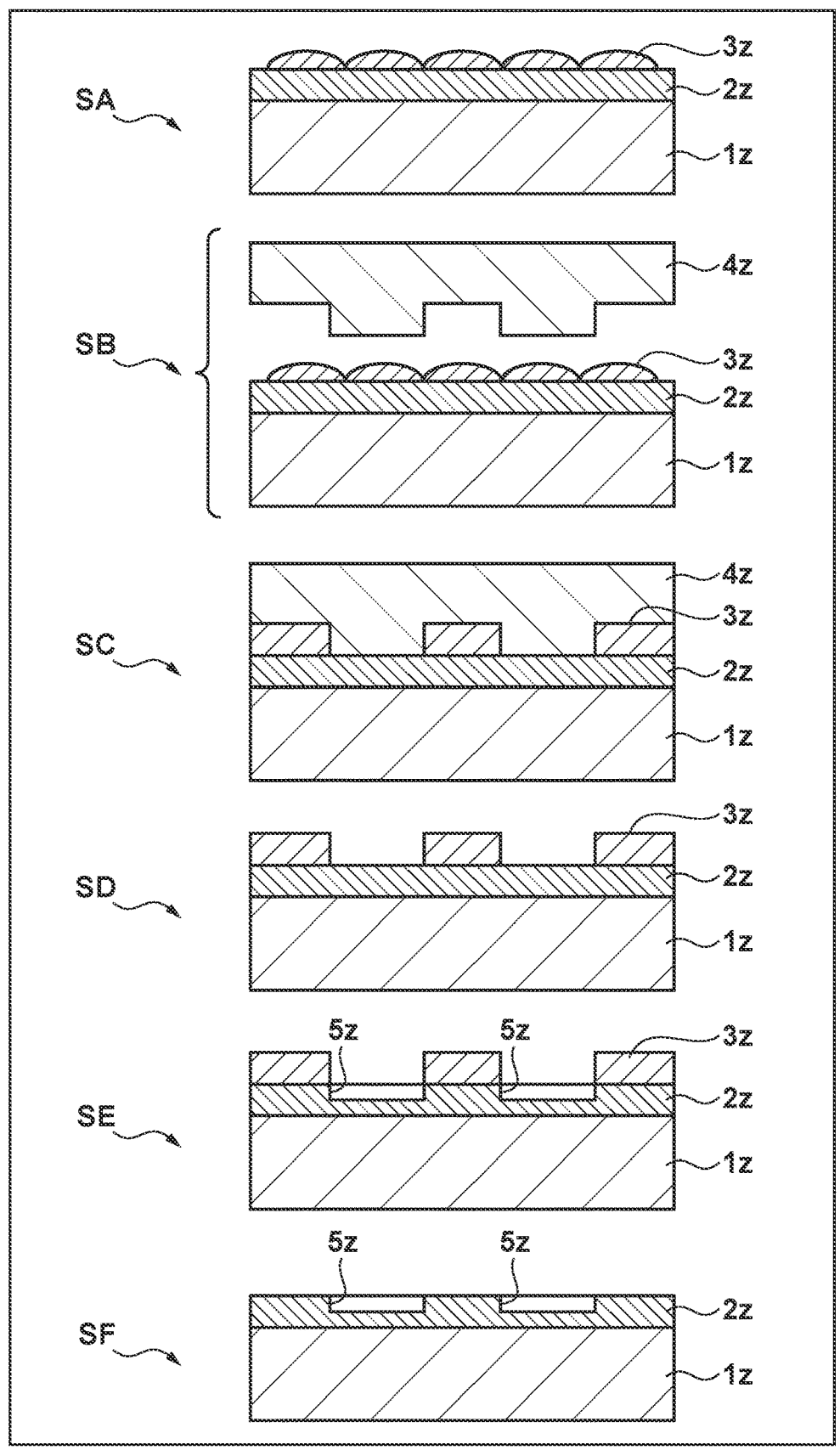
FIG. 19 is a view for explaining a method of manufacturing an article according to an embodiment.

As shown in step SB of FIG. 19, a side of a mold 4z for imprint with an uneven pattern is directed toward and made to face the imprint material 3z on the substrate. As shown in step SC of FIG. 19, the substrate 1z to which the imprint material 3z is applied is brought into contact with the mold 4z, and a pressure is applied. The gap between the mold 4z and the processed material 2z is filled with the imprint material 3z. In this state, when the imprint material 3z is irradiated with energy for curing via the mold 4z, the imprint material 3z is cured.

As shown in step SD of FIG. 19, after the imprint material 3z is cured, the mold 4z is separated from the substrate 1z. Then, the pattern of the cured product of the imprint material 3z is formed on the substrate 1z. In the pattern of the cured product, the concave portion of the mold corresponds to the convex portion of the cured product, and the convex portion of the mold corresponds to the concave portion of the cured product. That is, the uneven pattern of the mold 4z is transferred to the imprint material 3z.

As shown in step SE of FIG. 19, when etching is performed using the pattern of the cured product as an etching resistant mask, a portion of the surface of the processed material 2z where the cured product does not exist or remains thin is removed to form a groove 5z. As shown in step SF of FIG. 19, when the pattern of the cured product is removed, an article with the grooves 5z formed in the surface of the processed material 2z can be obtained. Here, the pattern of the cured product is removed. However, instead of processing or removing the pattern of the cured product, it may be used as, for example, an interlayer dielectric film included in a semiconductor element or the like, that is, a constituent member of an article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-107449, filed Jun. 7, 2019, which is hereby incorporated by reference herein in its entirety.

What is claimed is:

1. A forming apparatus that performs a forming process including a contact step of bringing a composition on a substrate into contact with a mold, a curing step of curing the composition while the composition is in contact with the mold, and a mold separation step of separating the cured composition from the mold, the apparatus comprising:
a substrate holder having a plurality of chucking regions that chuck a lower surface of the substrate and configured to hold the substrate by chucking the substrate with the plurality of chucking regions; and
a controller configured to control execution of the forming process and independently control a chucking force of each of the plurality of chucking regions,
wherein the controller is configured to control the chucking force of each of the plurality of chucking regions in the mold separation step so as to make a final mold separation point, at which the mold finally separates from the composition, coincide with a center of a pattern surface of the mold, and
wherein the controller is configured to start the mold separation step under a first chucking condition that weakens the chucking force of a chucking region other than a chucking region, of chucking regions under a shot region of the substrate, which is located nearest to an outer circumferential side of the substrate, so as to allow the shot region facing the pattern surface to deform in a convex shape with respect to the pattern surface at time of mold separation, and change from the first chucking condition to a second chucking condition that eliminates a difference in chucking force between chucking regions under the shot region.

2. The apparatus according to claim 1, further comprising an imaging device configured to capture an image of a contact region between the composition and the pattern surface,
wherein the controller is configured to decide a timing of changing from the first chucking condition to the second chucking condition based on the image of the contact region obtained by the imaging device in the mold separation step.

3. The apparatus according to claim 2, wherein the controller is configured to decide a timing at which the image enters a reference region as the timing of changing from the first chucking condition to the second chucking condition.

4. The apparatus according to claim 3, wherein the controller is configured to set the reference region, based on the image, so as to prevent occurrence of a defect caused by mold separation in a pattern of the formed composition and make the final mold separation point coincide with a center of the pattern surface.

5. The apparatus according to claim 2, further comprising a measurement device configured to measure a separation force as a force required to separate the cured composition from the mold,
wherein the controller is configured to decide the timing at which a separation force measured by the measurement device becomes equal to a reference separation force as the timing of changing from the first chucking condition to the second chucking condition.

6. The apparatus according to claim 5, wherein the controller is configured to set the reference separation force, based on the image, so as to prevent occurrence of a defect caused by mold separation in a pattern of the formed composition and make the final mold separation point coincide with a center of the pattern surface.

7. The apparatus according to claim 2, wherein the controller is configured to decide a timing at which a reference time has elapsed since a start of the mold separation step as the timing of changing from the first chucking condition to the second chucking condition.

8. The apparatus according to claim 7, wherein the controller is configured to set the reference time, based on the image, so as to prevent occurrence of a defect caused by mold separation in a pattern of the formed composition and make the final mold separation point coincide with a center of the pattern surface.

9. The apparatus according to claim 1, wherein the forming apparatus is an imprint apparatus configured to transfer a pattern of the mold onto an imprint material by bringing the imprint material as the composition on the substrate into contact with the mold.

10. The apparatus according to claim 1, wherein the forming apparatus is a planarization apparatus configured to form a planarized film made of the composition on the substrate by bringing the composition on the substrate into contact with a planarized surface of the mold.

* * * * *